United States Patent
Horiguchi et al.

(10) Patent No.: US 6,815,759 B2
(45) Date of Patent: Nov. 9, 2004

(54) SEMICONDUCTOR MEMORY WITH FLOATING GATE TYPE FET

(75) Inventors: Naoto Horiguchi, Kawasaki (JP); Tatsuya Usuki, Kawasaki (JP); Kenichi Goto, Berkeley, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/726,386

(22) Filed: Dec. 1, 2000

(65) Prior Publication Data

US 2001/0002712 A1 Jun. 7, 2001

(30) Foreign Application Priority Data

Dec. 3, 1999 (JP) .......................................... 11-345437

(51) Int. Cl.⁷ .......................................... H01L 29/788
(52) U.S. Cl. ...................... 257/316; 257/317; 257/319; 257/320; 257/321
(58) Field of Search ............................. 257/314–317, 257/319–321; 438/201, 257

(56) References Cited

U.S. PATENT DOCUMENTS

| | | | | |
|---|---|---|---|---|
| 5,482,879 A | * | 1/1996 | Hong | ......................... 257/316 |
| 5,511,020 A | * | 4/1996 | Hu et al. | ................ 365/185.28 |
| 5,614,746 A | * | 3/1997 | Hong et al. | .................. 257/316 |
| 5,770,877 A | * | 6/1998 | Park | ........................... 257/315 |
| 6,222,224 B1 | * | 4/2001 | Shigyo | ........................ 257/315 |

FOREIGN PATENT DOCUMENTS

JP      2000-150680      5/2000

* cited by examiner

*Primary Examiner*—Thien F Tran
(74) *Attorney, Agent, or Firm*—Westerman, Hattori, Daniels & Adrian, LLP

(57) ABSTRACT

A tunneling insulating film is formed on the partial surface area of a semiconductor substrate. A floating gate electrode is formed on the tunneling insulating film. A gate insulating film covers the side wall of the floating gate electrode and a partial surface area of the semiconductor substrate on both sides of the floating gate electrode. A first control gate electrode is disposed on the gate insulating film over the side wall of the floating gate electrode and over a partial surface area of the semiconductor substrate on both sides of the floating gate electrode. A pair of impurity doped regions is formed in a surface layer of the semiconductor substrate on both sides of a gate structure including the floating gate structure and first control gate structure.

6 Claims, 15 Drawing Sheets

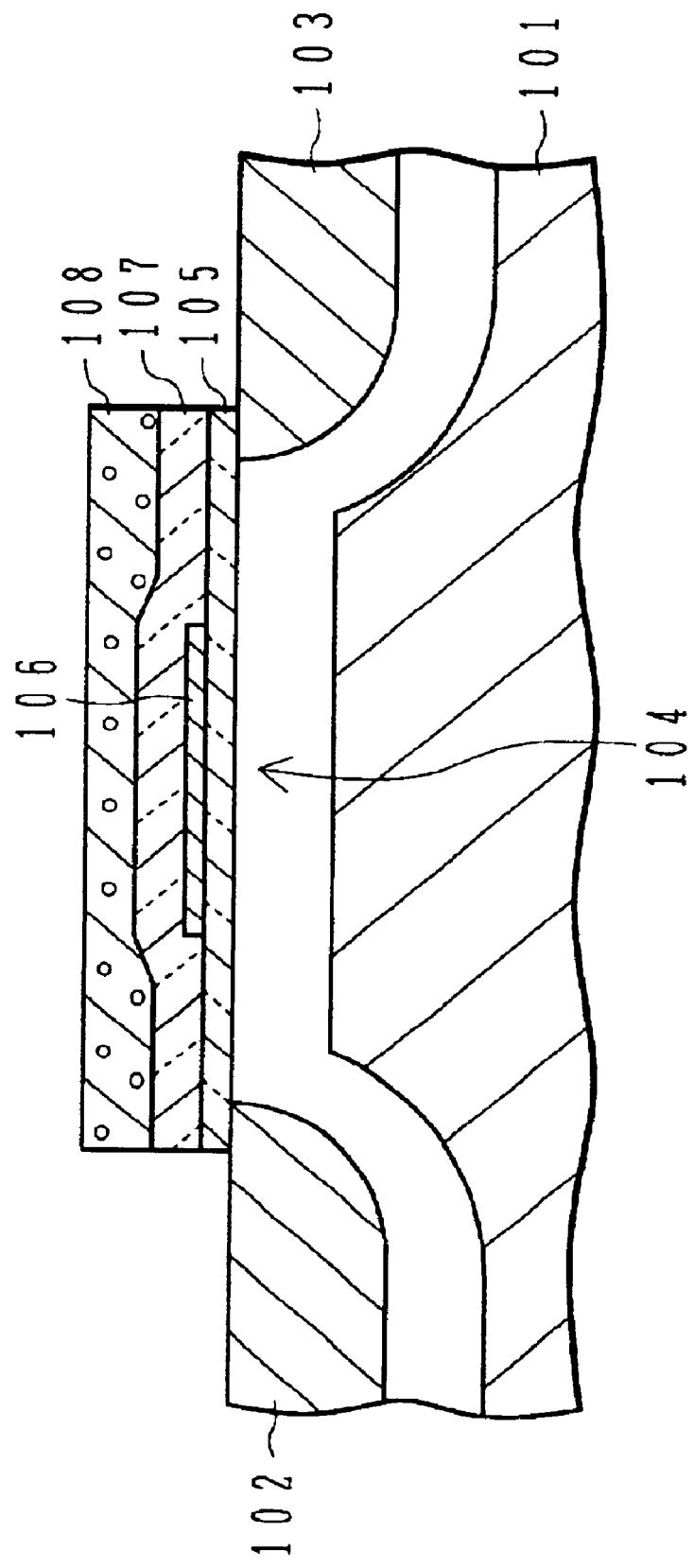

SEMICONDUCTOR MEMORY WITH FLOATING GATE TYPE FET

This application is based on Japanese Patent Application No. HEI 11-345437 filed on Dec. 3, 1999, the entire contents of which are incorporated herein by reference.

BACKGROUND OF THE INVENTION a) Field of the Invention

The present invention relates to a semiconductor memory realized basing upon a new operation principle. Dynamic random access memories (DRAMs) are known as typical semiconductor memories. One bit data is stored in one memory cell of DRAM which is constituted of one MISFET and one capacitor. DRAMs having ultra fine memory cells and a high capacity are under developments. Semiconductor memories capable of realizing a still larger capacity have been desired to date.

b) Description of the Related Art

A flash memory has drawn attention as semiconductor memories capable of realizing a larger capacity. The flash memory is suitable for realizing a larger capacity because one memory cell is constituted of only one MISFET.

Data is stored in a flash memory by injecting carriers into a floating gate electrode of a floating gate type FET. In order to retain carriers injected into the floating gate electrode, the thickness of an insulating film between the floating gate electrode and the channel region is set to more than 8 nm. Carriers are injected via this insulating film into the floating gate electrode by applying a high voltage across the channel region and floating gate electrode. As a high voltage is applied between them, carriers are injected into the floating gate electrode by the Fowler-Nordheim tunneling (FN tunneling) phenomenon.

A voltage of about 10 to 20 V is required in order to inject carriers into the floating gate electrode by the FN tunneling phenomenon. It is therefore difficult to lower the voltage and reduce a power consumption.

SUMMARY OF THE INVENTION

It is an object of the present invention to provide a semiconductor memory capable of realizing a large capacity and a low voltage.

According to one aspect of the present invention, there is provided a semiconductor memory comprising: a semiconductor substrate; a tunneling insulating film formed on a partial surface area of said semiconductor substrate, said tunneling insulating film having a thinness enough to transmit carriers therethrough by a tunneling phenomenon; a floating gate electrode formed on said tunneling insulating film; a gate insulating film covering a side wall of said floating gate electrode and a partial surface area of said semiconductor substrate on both sides of said floating gate electrode, said gate insulating film having a thickness not allowing carriers to transmit therethrough by the tunneling phenomenon; a first control gate electrode disposed on said gate insulating film over the side wall of said floating gate electrode and over a partial surface area of said semiconductor substrate on both sides of said floating gate electrode; and a pair of impurity doped regions formed in a surface layer of said semiconductor substrate on both sides of a gate structure including said floating gate electrode and said first control gate electrode.

As a voltage is applied between the control gate electrode and impurity doped regions, carriers in the channel region tunnel through the tunneling insulating film and are injected into the floating gate electrode. Injected carriers change the threshold voltage so that data can be read. Carriers injected into the floating gate electrode do not tunnel through the gate insulating film.

According to another aspect of the present invention, there is provided a method of manufacturing a semiconductor memory, comprising the steps of: forming a tunneling insulating film on a surface of a semiconductor substrate, the tunneling film having a thinness enough to transmit carriers therethrough by a tunneling phenomenon; forming a first conductive film on the tunneling insulating film, the first conductive film being made of conductive material or semiconductor material; forming a dielectric film on the first conductive film, the dielectric film having a thickness not allowing carriers to transmit therethrough by the tunneling phenomenon; forming a second conductive film on the dielectric film, the second conductive film being made of conductive material or semiconductor material; patterning a lamination structure from an upper surface of the second conductive film to at least a lower surface of the first conductive film to leave a laminated mesa including the first conductive film, the dielectric film and the second conductive film; forming a gate insulating film covering upper and side surfaces of the laminated mesa and a partial surface of the semiconductor substrate on both sides of the laminated mesa, the gate insulating film having a thickness not allowing carriers to transmit therethrough by the tunneling phenomenon; forming a third conductive film covering a whole surface of the gate insulating film, the third conductive film being made of conductive material or semiconductor material; anisotropically etching the third conductive film to leave a side control gate electrode made of the third conductive film over a side wall of the laminated mesa; doping impurities in a surface layer of the semiconductor substrate on both sides of a gate structure including the laminated mesa and the side control gate electrode to form impurity doped regions; and electrically connecting the side control gate electrode to the second conductive film constituting the laminated mesa.

The first conductive film constituting the laminated mesa operates as the floating gate electrode. The side control gate can be formed in a self-alignment manner relative to the floating gate electrode.

According to another aspect of the present invention, there is provided a method of manufacturing a semiconductor memory, comprising the steps of: forming an element separation insulating film on a surface of a semiconductor substrate to define an active region surrounded with the element separation insulating film; forming a tunneling insulating film on the active region, the tunneling insulating film having a thinness enough to transmit carriers therethrough by a tunneling phenomenon; forming a first conductive member on the tunneling insulating film, the first conductive film traversing the active region and made of conductive material or semiconductor material; forming a gate insulating film on upper and side surfaces of the first conductive member and on a partial area of the active region on both sides of the first conductive member, the gate insulating film having a thickness not allowing carriers to transmit therethrough by the tunneling phenomenon; covering a surface of the gate insulating film with a conductive film made of conductive material or semiconductor material; anisotropically etching the conductive film to leave a side control gate electrode made of the conductive film over a side wall of the first conductive member; and doping impurities in a surface layer of the active region on both sides of a gate structure including the first conductive member and the side control gate electrode.

The first conductive film functions as the floating gate electrode. The side control gate can be formed in a self-alignment manner relative to the floating gate electrode.

According to another aspect of the present invention, there is provided a method of manufacturing a semiconductor memory, comprising the steps of: forming an element separation insulating film on a surface of a semiconductor substrate to define an active region surrounded with the element separation insulating film; forming a first film over the whole surface of the semiconductor substrate; forming an opening through the first film, the opening traversing the active region; forming a gate insulating film on a surface of the active region exposed on a bottom of the opening, the gate insulating film having a thickness not allowing carriers to transmit therethrough by tunneling phenomena; forming a second film on bottom and side surfaces of the opening and on an upper surface of the first film, the second film being made of conductive material or semiconductor material; anisotropically etching the second film to leave side control gate electrode of the second film on the side surfaces of the opening and to expose a surface of the active region in a central area of the bottom of the opening; forming a tunneling insulating firm on the exposed surface of the active region, the tunneling insulating film having a thinness enough to transmit carriers therethrough by the tunneling phenomenon, and forming a dielectric film on a side wall of the side control gate electrode, the dielectric film having a thickness not allowing carriers to transmit therethrough by the tunneling phenomenon; forming a third film burying the opening and covering an upper surface of the first film, the third film being made of conductive material or semiconductor material; etching back the third film to remove the third film on the first film and to leave a floating gate electrode of the third film in the opening; removing the first film; and doping impurities in a surface layer of the active region on both sides of a gate structure including the side control gate electrode and the floating gate electrode.

The floating gate electrode can be formed in a self-alignment manner relative to the side control gate electrode.

According to another aspect of the present invention, there is provided a method of manufacturing a semiconductor memory, comprising the steps of: forming an element separation insulating film on a surface of a semiconductor substrate to define an active region surrounded with the element separation insulating film; forming a dummy gate electrode on the active region, the dummy gate electrode traversing the active region; doping impurities in a surface layer of the active region on both sides of the dummy electrode; forming a first film over the semiconductor substrate, the first film covering the dummy gate electrode; removing the first film on an upper surface of the dummy gate electrode to expose the upper surface of the dummy gate electrode; removing the dummy gate electrode to expose a surface of the active region; forming a gate insulating film on the exposed surface of the active region, the gate insulating film having a thickness not allowing carriers to transmit therethrough by a tunneling phenomenon; forming a second film on a surface of the first film and on the gate insulating film, the second film being made of conductive material or semiconductor material; anisotropically etching the second film to leave a side control gate electrode of the second film on a side wall of the first film and to expose a surface of the active region in an area surrounded by the side control gate electrode; forming a tunneling insulating film on the exposed surface of the active region, the tunneling insulating film having a thinness enough to transmit carriers therethrough by the tunneling phenomenon, and forming a dielectric film on a side wall of the side control gate electrode, the dielectric film having a thickness not allowing carriers to transmit therethrough by the tunneling phenomenon; forming a third film burying a space surrounded by the side control gate electrode and covering an upper surface of the first film, the third film being made of conductive material or semiconductor material; and etching back the third film to remove the third film on the first film and to leave a floating gate electrode of the third film in the space surrounded by the side control gate electrode.

The floating gate electrode can be formed in a self-alignment manner relative to the side control gate electrode. Since impurities are doped before the gate electrode is formed, the gate electrode and dielectric film are not exposed to a high temperature process for impurity activation.

According to another aspect of the present invention, there is provided a method of manufacturing a semiconductor memory, comprising the steps of: forming an element separation insulating film on a surface of a semiconductor substrate to define an active region surrounded with the element separation insulating film; forming a tunneling insulating film on the active region of the semiconductor substrate, the tunneling insulating film having a thinness enough to transmit carriers therethrough by a tunneling phenomenon; forming a first conductive member on the tunneling insulating film, the first conductive film traversing the active region and made of conductive material or semiconductor material; forming a side wall member on a side wall of the first conductive member; doping impurities in a surface layer of the active region on both sides of a mesa including the first conductive member and the side wall member; removing the side wall member; forming a gate insulating film on upper and side surfaces of the first conductive member and on a partial area of the active region on both sides of the first conductive member, the gate insulating film having a thickness not allowing carriers to transmit therethrough by the tunneling phenomenon; covering a surface of the gate insulating film with a conductive film made of conductive material or semiconductor material; and anisotropically etching the conductive film to leave a side control gate electrode made of the first conductive film over a side wall of the first conductive member.

The first conductive member functions as the floating gate electrode. The side control gate electrode is formed in a self-alignment manner relative to the floating gate electrode. Since impurities are doped before the side control gate electrode and gate insulating film are formed, the side control gate electrode and gate insulating film are not exposed to a high temperature process for impurity activation.

As above, since carriers can be injected into the floating gate electrode by direct tunneling, data read/write can be performed at a relatively low voltage. One memory cell is constituted of only one floating gate type FET. High integration is therefore possible. One of the floating gate electrode and control gate electrode can be formed in a self-alignment manner relative to the other. It is therefore possible to prevent a lowered yield to be caused by position misalignment.

BRIEF DESCRIPTION OF THE DRAWINGS

FIG. 10 is a cross sectional view of a semiconductor memory already proposed.

DETAILED DESCRIPTION OF THE PREFERRED EMBODIMENTS

Figure 1A:
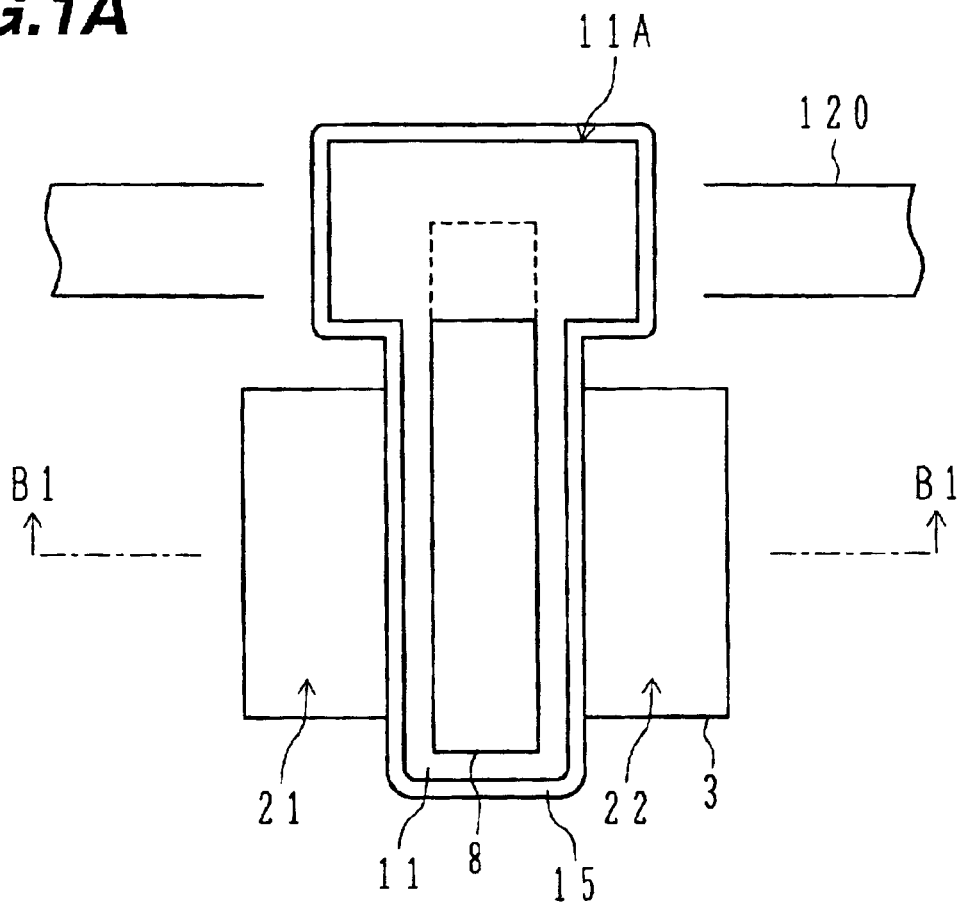
FIGS. 1A and 1B are a plan view and a cross sectional view of a semiconductor memory according to a first embodiment of the invention.

Prior to describing the embodiments of the invention, a semiconductor memory already proposed by one of the present inventors and others will be described with reference to FIGS. 10 to 13.

FIG. 10 is a cross sectional view of one memory cell of the semiconductor memory already proposed.

In the surface layer of a p$^-$-type silicon substrate 101, an n-type source region 102 and an n-type drain region 103 are formed on both sides of a channel region 104. The impurity concentration of the p$^-$-type silicon substrate is, for example, $5\times10^{15}$ cm$^{-3}$. The channel length, i.e., a distance between the source and drain regions 102 and 103, is 150 nm for example. A tunneling insulating film 105 made of SiO$_2$ and having a thickness of 2 to 3 nm is formed on the surface of the channel region 104. The thickness of the tunneling insulating film 105 is set so that carriers can tunnel therethrough by the tunneling phenomenon.

On the surface of the tunneling insulating film 105, a floating gate electrode 106 having a thickness of 10 nm is formed. The floating gate electrode 106 is made of refractory metal such as TiN. The floating gate electrode 106 is disposed so as to overlap neither the source region 102 nor the drain region 103, as viewed along the substrate normal direction. For example, the distance between the edge of the floating gate electrode 106 on the side of the source region 102 and the edge of the source region 102 on the side of the channel region 104, and the distance between the edge of the floating gate electrode 106 on the side of the drain region 103 and the edge of the drain region 103 on the side of the channel region 104, are both set to 50 nm.

A gate insulating film 107 made of SiO$_2$ and having a thickness of 6 to 10 nm is formed covering the tunneling insulating film 105 and floating gate electrode 106. On the surface of the gate insulating film 107, a control gate electrode 108 made of n$^+$-type polysilicon is formed. The outer peripheries of a lamination structure including the tunneling insulating film 105, gate insulating film 107 and control gate electrode 108 on the sides of the source and drain regions 102 and 103 are disposed so that they become in contact with, or partially overlap, the edges of the source and drain regions 102 and 103 as viewed along the substrate normal direction.

While a voltage is not applied to the control gate electrode 108, a surface layer of the channel region 104 is depleted. A depletion layer is also formed at the interface between the p$^-$-type silicon substrate 101 and source region 102 and at the interface between the p$^-$-type silicon substrate 101 and drain region 103.

Next, the operation principle of the semiconductor memory already proposed shown in FIG. 10 will be described with reference to FIGS. 11A to 11D.

Figure 11A:
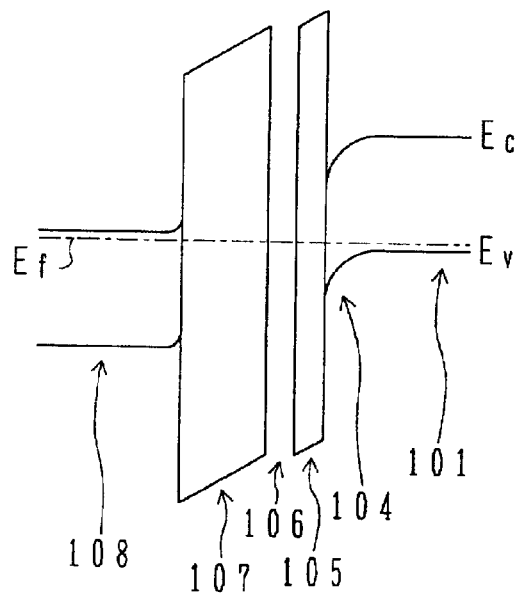
FIGS. 11A to 11D are energy band diagrams illustrating the operation principle of the semiconductor memory already proposed and semiconductor memories according to the embodiments of the invention.

FIG. 11A is an energy band diagram of the memory while a voltage is not applied to the control gate electrode 108. The band edge of the channel region 104 curves downward, and the surface layer of the channel region 104 is depleted. A Fermi level Ef of the floating gate electrode 106 is positioned between the lower edge Ec of the conduction band and the upper edge Ev of the valence band respectively of the channel region 104, i.e., positioned in the energy band gap.

Figure 11B:
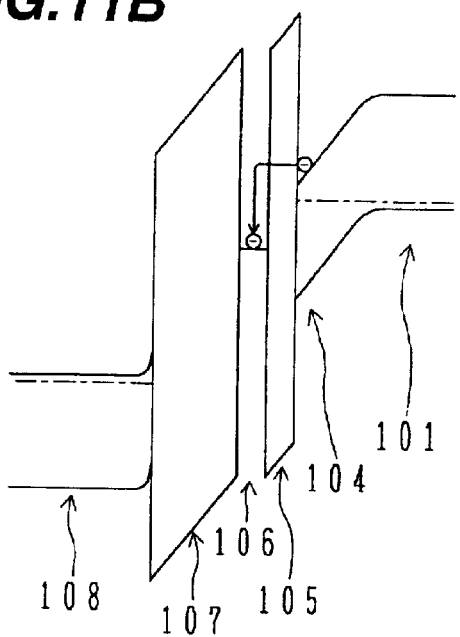

FIG. 11B is an energy band diagram during data write. A positive voltage relative to the source/drain regions is applied to the control gate electrode 108. For example, a voltage of +5 V is applied to the control gate electrode 108. A potential difference of about 1.5 V is generated between the floating gate electrode 106 and channel region 104. This potential difference forms an inversion layer in the surface layer of the channel region 104. Electrons in the inversion layer are injected into the floating gate electrode 106 by the tunneling phenomenon. The injected electrons have an energy level near at the Fermi level of the floating gate electrode 106.

Figure 11C:
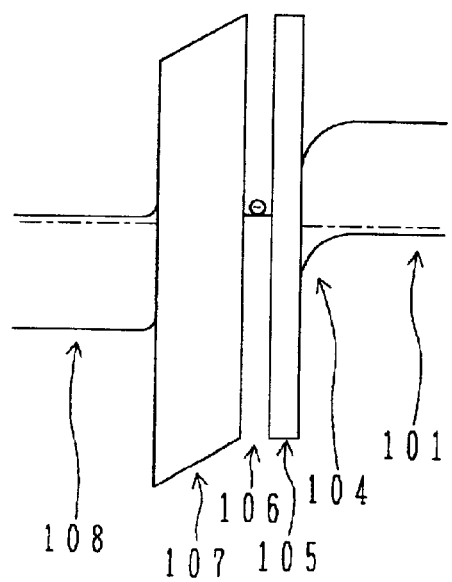

FIG. 11C is an energy band diagram in a data retention state. Since electrons are accumulated in the floating gate electrode 106, the electric potential of the floating gate electrode 106 lowers more than the state shown in FIG. 11A. Therefore, the band edge of the surface of the channel region 104 curves less than the state shown in FIG. 11A. The threshold value of the floating gate type FET is higher in the state shown in FIG. 11C than in the state shown in FIG. 11A. By detecting a difference between these two threshold values, stored data can be read.

In the state shown in FIG. 11C, the Fermi level of the floating gate electrode 106 is positioned in the energy band gap of the channel region 104. Therefore, the electrons having the energy level near at the Fermi level will not enter the channel region 104 by the tunneling phenomenon. Holes hardly exist in the surface layer of the channel region 104 so that holes will not be injected from the channel region 104 into the floating gate electrode 106.

Referring to FIG. 10, opposite ends of the floating gate electrode 106 and the source/drain regions 102 and 103 are disposed to have a sufficient distance for inhibiting carriers from tunneling into the floating gate electrode 106. Therefore, the electrons accumulated in the floating gate electrode 106 will not enter the source/drain regions 102 and 103 by the tunneling phenomenon. Electrons in the floating gate electrode 106 can therefore be retained therein for a long time. It is therefore necessary to set each of the distances between both ends of the floating gate electrode 106 and the source/drain regions 102 and 103 longer than the thickness of the tunneling insulating film 105.

Figure 11D:
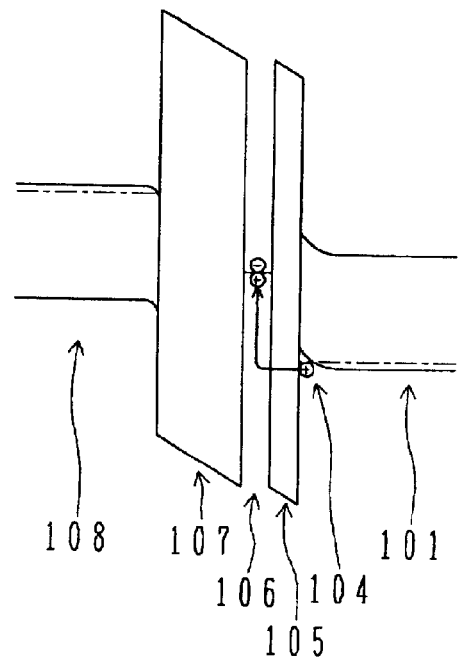

FIG. 11D is an energy band diagram during data erase. A negative voltage relative to the source/drain regions 102 and 103 is applied to the control gate electrode 108. For example, 0 V is applied to the source/drain regions and −5 V is applied to the control gate electrode 108. An accumulation layer is formed in the surface layer of the channel region 104. Holes in this accumulation layer are injected into the floating gate electrode 106 by the tunneling phenomenon. As the holes are injected, charges accumulated in the floating gate electrode 106 are neutralized. When the voltage is not applied to the control gate electrode 108, the state shown in FIG. 11A resumes.

During the data write shown in FIG. 11B and the data erase shown in FIG. 11D, carriers directly tunnel through the tunneling insulating film 105. The FN tunneling phenomenon is not used, but direct tunneling phenomenon is used in the semiconductor memory. Therefore, data write and data erase can be performed at a relatively low voltage.

Although the floating gate electrode shown in FIG. 10 and FIGS. 11A to 11D is made of refractory metal, it may be made of other materials such as n-type polysilicon.

FIGS. 12A to 12D are energy band diagrams illustrating the operation principle of a semiconductor memory having a floating gate electrode made of n-type polysilicon.

Figure 12A:
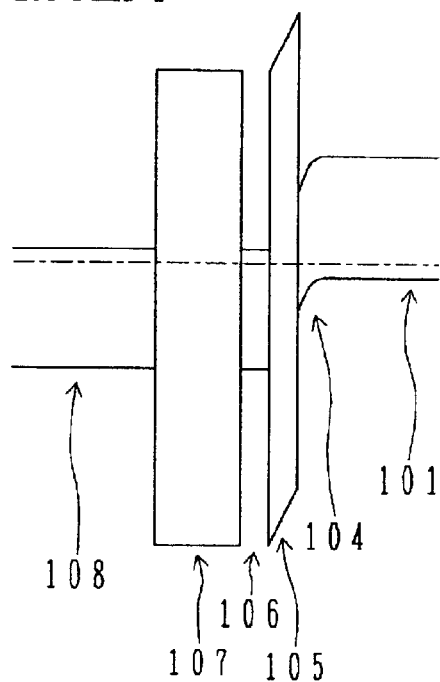
FIGS. 12A to 12D are energy band diagrams illustrating the operation principle of the semiconductor memory already proposed and semiconductor memories according to the embodiments of the invention.

FIG. 12A is an energy band diagram of the memory while a voltage is not applied to the control gate electrode 108. The band edge curves downward near the surface of the channel region 104. A Fermi level of the floating gate electrode 106 is positioned in the energy band gap of the channel region 104.

Figure 12B:
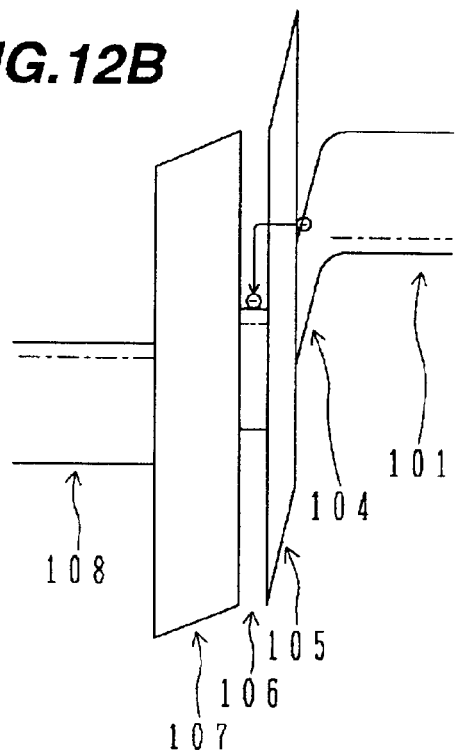

FIG. 12B is an energy band diagram during the data write. A positive voltage relative to the source/drain regions 102 and 103 is applied to the control gate electrode 108. An inversion layer is formed in the surface layer of the channel region 104. Electrons in the inversion layer are injected into the floating gate electrode 106 by the tunneling phenomenon. The injected electrons have an energy level near at the Fermi level, i.e., an energy level near at the lower edge of the conduction band.

Figure 12C:
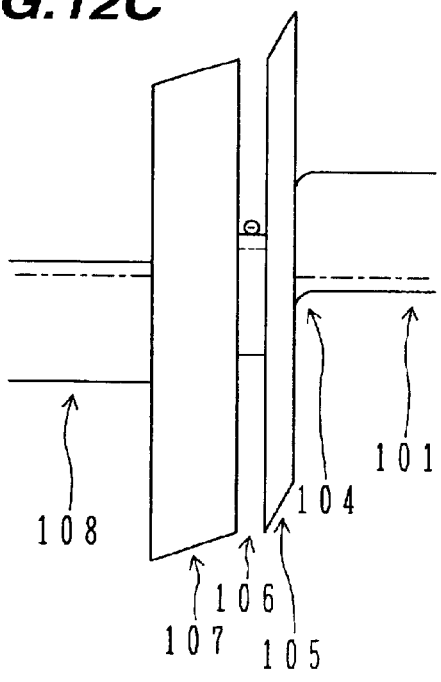
Figure 12D:
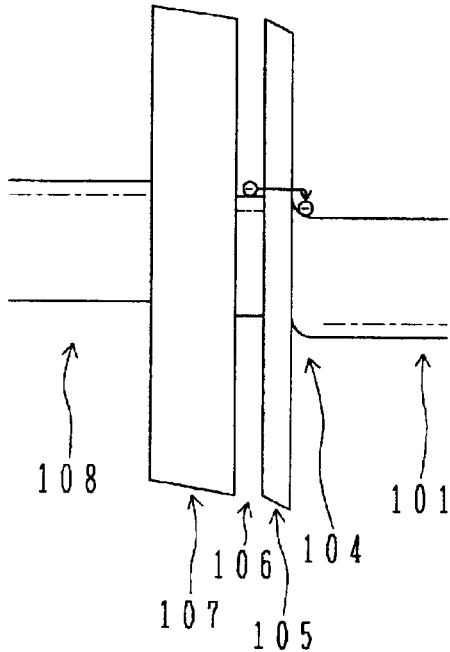

FIG. 12C is an energy band diagram in the data retention state. Since negative charges are accumulated in the floating gate electrode 106, the potential of the floating gate electrode 106 lowers. Therefore, the band edge of the surface of the channel region 104 curves less than the state shown in FIG. 12A. The threshold value of the floating gate type FET is higher in the state shown in FIG. 12C than in the state shown in FIG. 12A.

The Fermi level of the floating gate electrode 106 is positioned in the energy band gap of the channel region 104. Further, since the impurity concentration of the surface layer of the channel region 104 is set high, most of the potential difference between the channel region 104 and floating gate electrode 106 is applied to the tunneling insulating film 105.

Since a large potential difference is applied across the tunneling insulating film 105, the surface of the channel region 104 has no energy level corresponding to the energy level of electrons excessively accumulated at the lower edge of the conduction band of the floating gate electrode 106. Therefore, the electrons injected into the floating gate electrode 106 will not enter the channel region 104 by the tunneling phenomenon. Since the electrons will not enter the channel region 104, it is possible to retain the electrons injected into the floating gate electrode 106 for a long time.

Figure 13:
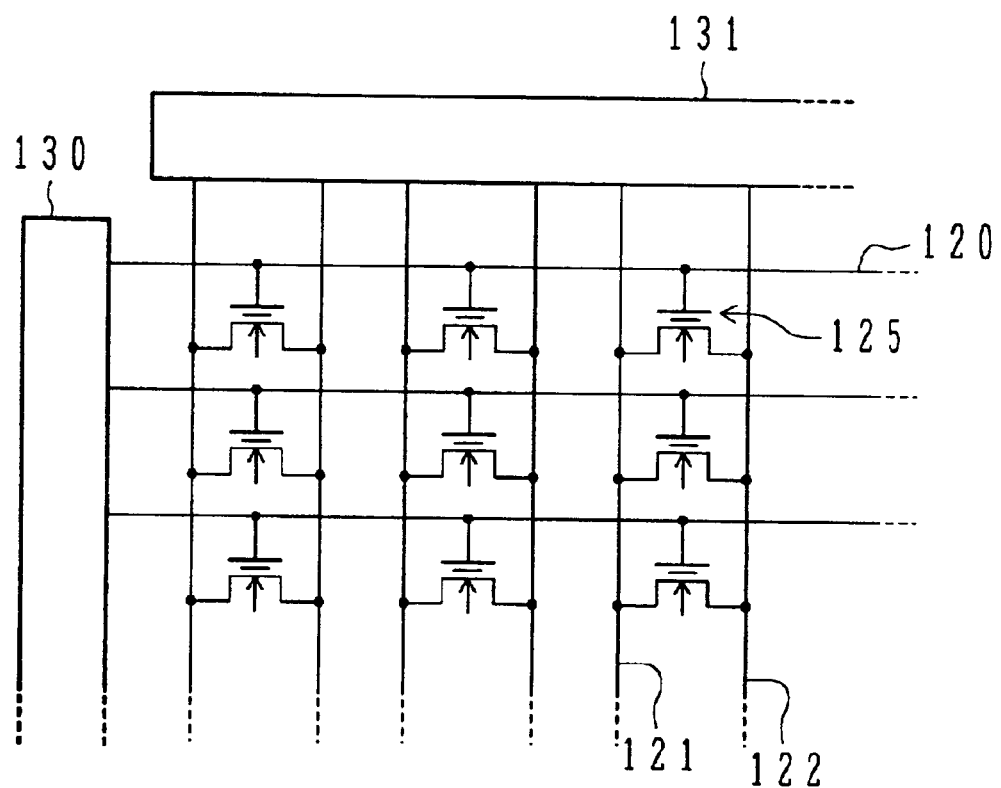
FIG. 13 is an equivalent circuit of the semiconductor memory already proposed and semiconductor memories according to the embodiments of the invention.

FIG. 13 is an equivalent circuit of a semiconductor memory already proposed. A plurality of gate lines 120 disposed in parallel extends in the horizontal direction of FIG. 13. A plurality of source lines 121 and drain lines 122 disposed in parallel extend in the vertical direction of FIG. 13. The source and drain lines 121 and 122 are alternately disposed.

A floating gate type FET 125 is disposed at a cross point between a pair of source and drain lines 121 and 122 and one gate line 120. The control gate electrode, source region and drain region of the floating gate type FET 125 are connected to corresponding gate line 120, source line 121 and drain line 122. All of the gate lines 120 are connected to a gate line controller 130, and all of the source and drain lines 121 and 122 are connected to a source/drain line controller 131.

A method of writing data in one memory cell will be described. A voltage of 0 V is applied to the source and drain lines 121 and 122 corresponding to a memory cell in which data is to be written, and a voltage (+Vwrite) is applied to the corresponding gate line 120. The source and drain lines 121 and 122 not selected are applied with the voltage (+Vwrite), and the gate lines 120 not selected are applied with the voltage of 0 V. These voltages are applied under the control of the gate line controller 130 and source/drain line controller 131.

Data is written in the selected memory cell by applying a voltage Vwrite between the control gate electrode and channel region. In the memory cell not selected, a p-n junction between the source/drain regions and channel region is reversely biased. Therefore, an electric field is concentrated upon an area between the opposite ends of the control gate electrode 108 shown in FIG. 10 and the ends of the source/drain regions 102 and 103, and a large voltage is not applied between the floating gate electrode 107 and channel region 104. Therefore, data is not written in the memory cells not selected.

In erasing the stored data, a voltage (−Vwrite) is applied to the gate line 120. Data in the memory cells connected to the gate line 120 applied with the voltage (−Vwrite) is all erased.

Next, a method of reading data will be described. A voltage+Vread is applied to the gate line 120 of the memory cell from which data is to be read. The voltage+Vread has a middle value between the threshold value during the data erase state and the threshold value during the data write state. The other gate lines 120 are applied with a voltage of 0 V to make all memory cells non-conductive. A voltage is applied between the source and drain lines 121 and 122 of the memory cell from which data is to be read, and current flowing between the source and drain lines 121 and 122 is detected. Current hardly flows if data has been written in the memory cell, whereas current flows if data was erased.

Next, the embodiments of the invention will be described. The floating gate electrode of the semiconductor memory previously proposed is shorter than the control gate electrode along a current flow direction. Fine masks are therefore necessary to form these gates by correctly aligning the control gate electrode on the floating gate electrode. This results in a lowered yield and an increased manufacture cost. According to the embodiments of the invention, one of the floating gate electrode and control gate electrode is formed in a self-alignment manner relative to the other. The operation principle of semiconductor memories of the embodiments to be described in the following is similar to that of the semiconductor memory previously proposed and described with reference to FIGS. 11A to 11D and FIGS. 12A to 12D. The circuit structure of integrated memory cells is also similar to that previously proposed and described with FIG. 13.

With reference to FIGS. 1A to 2F, the structure and manufacture method of a semiconductor memory according to the first embodiment will be described.

Figure 1B:
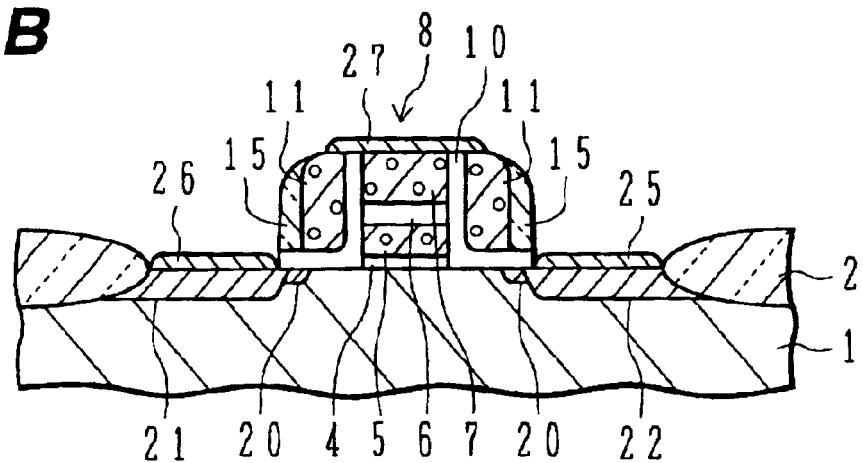

FIG. 1A is a plan view of one memory cell of a semiconductor memory according to the first embodiment, and FIG. 1B is a cross sectional view taken along one-dot chain line B1—B1 shown in FIG. 1A.

An active region 3 is defined by a field oxide film 2 formed on the surface of a p⁻-type silicon substrate 1 having a resistivity of about 10 Ωcm. A tunneling insulating film 4 of silicon oxide is formed in a stripe area traversing the active region 3. The tunneling insulating film 4 has a thickness enough to transmit carriers therethrough by the tunneling phenomenon, e.g., about 3 nm thick. A floating gate electrode 5 is formed on the tunneling insulating film 4. The floating gate electrode 5 is made of phosphorous-doped n-type polysilicon having an impurity concentration of about $1 \times 10^{20}$ cm$^{-3}$. The length of the floating gate electrode 5 is about 100 nm.

A dielectric film 6 of silicon oxide is formed on the floating gate electrode 5. The dielectric film 6 has a thickness not allowing carriers to transmit therethrough by the tunneling phenomenon, e.g., about 5 to 10 nm thick.

An upper control gate electrode 7 is formed on the dielectric film 6. The upper control gate electrode 7 is made of phosphorous-doped n-type polysilicon having an impurity concentration of about $1 \times 10^{20}$ cm$^{-3}$.

A laminated mesa 8 is constituted of the tunneling insulating film 4, floating gate electrode 5, dielectric film 6 and upper control gate electrode 7. The laminated mesa 8 extends on the field oxide film 2 outside of the active region 3. A gate insulating film 10 covers the side wall of the laminated mesa 8 and a partial surface area of the active region 3 continuous with the side wall. The gate insulating film 10 has a thickness not allowing carriers to transmit therethrough by the tunneling phenomenon, e.g., about 5 to 10 nm thick.

The side control gate electrode 11 is formed on the surface of the gate insulating film 10. The side control gate electrode 11 is made of phosphorous doped n-type polysilicon having an impurity concentration of about $1 \times 10^{20}$ cm$^{-3}$. A lateral thickness of the side control gate electrode is about 100 nm.

The side control gate electrode 11 extends to the field oxide film 2, similar to the laminated mesa 8. The side control gate electrode 11 is broadened on the field oxide film 2 to form a pad 11A which occupies a large area on the substrate surface. The pad 11A is disposed not only on the side wall of the laminated mesa 8 but also on the upper surface thereof. The gate insulating film 10 is left between the pad 11A disposed on the upper surface of the laminated mesa 8 and the upper control gate 7. The side wall insulating film 15 of silicon oxide is formed on the side wall of the side control gate electrode 11.

Arsenic (As) doped extension regions 20 are formed in the surface layer of the active region 3 under the side wall insulating film 15. Arsenic (As) doped source and drain regions 21 and 22 are formed in the surface layer of the active region 3 outside of the side wall insulating film 15. The extension region 20 is shallower than the impurity doped region 21, 22 and has an impurity concentration lower than that of the impurity doped region 21, 22. The extension region 20 prevents punch-through to be caused by the short channel effect.

Cobalt silicide films 25 and 26 are formed on the surfaces of the source region 21 and drain region 22. Another cobalt silicide film 27 is formed on the upper control gate electrode 7 and the side control gate electrode 11. This cobalt silicide film 27 is formed on the upper surface of the pad 11A, since the pad 11A covers the upper control gate 7 in the area where the pad 11A is disposed.

The cobalt silicide film 27 electrically connects the upper control gate electrode 7 and the side control gate electrode 11. The pad 11A is connected to a gate bus line 120 formed in a wiring layer upper than the pad 11A.

Although the floating gate electrode 5 shown in FIGS. 1A and 1B is made of polysilicon, it may be made of other conductive metal materials or semiconductor materials such as TiN, Ge and SiGe. The upper control gate electrode 7 and side control gate electrode 11 may be made of semiconductor or metal material other than polysilicon.

Next, a method of manufacturing a semiconductor memory of the first embodiment will be described with reference to FIGS. 2A to 2F.

Figure 2A:
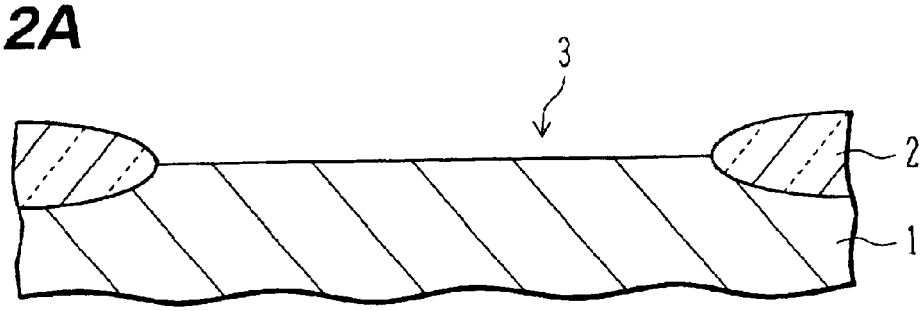
FIGS. 2A to 2F are cross sectional views of a substrate illustrating a method of manufacturing a semiconductor memory according to the first embodiment of the invention.

As shown in FIG. 2A, the surface of a p⁻-type silicon substrate 1 is locally and thermally oxidized to form a field oxide film 2. An active region 3 is defined by being surrounded with the field oxide film 2. Boron (B) ions are implanted into the surface layer of the active region 3 under the conditions of an acceleration energy of 10 keV and a dose of $2 \times 10^{13}$ cm$^{-2}$.

Figure 2B:
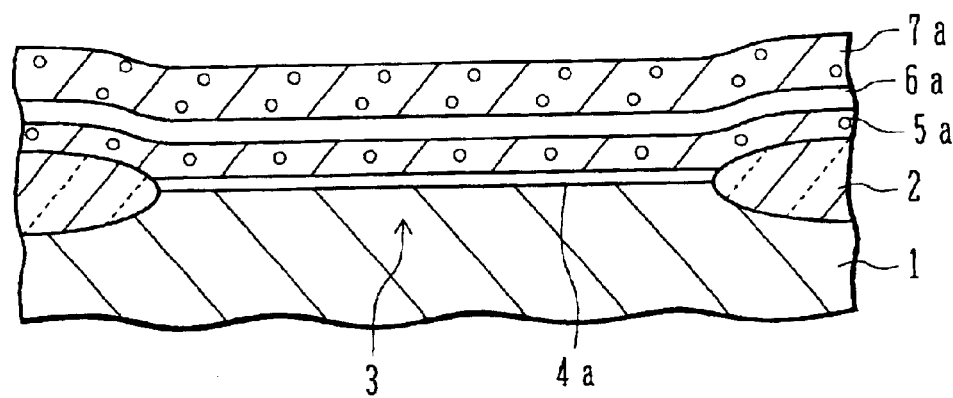

As shown in FIG. 2B, the surface of the active region 3 is thermally oxidized to form a silicon oxide film 4a having a thickness of 3 nm. On the field oxide film 2 and silicon oxide film 4a, a polysilicon film 5a is formed to a thickness of 80 nm by chemical vapor deposition (CVD). The surface of the polysilicon film 5a is thermally oxidized to form a silicon oxide film 6a having a thickness of 5 to 10 nm. On this silicon oxide film 6a, a polysilicon film 7a having a thickness of 100 nm is formed by CVD. During the growth of the polysilicon films 5a and 7a, phosphorous (P) is doped therein to an impurity concentration of $1 \times 10^{20}$ cm$^{-3}$.

Figure 2C:
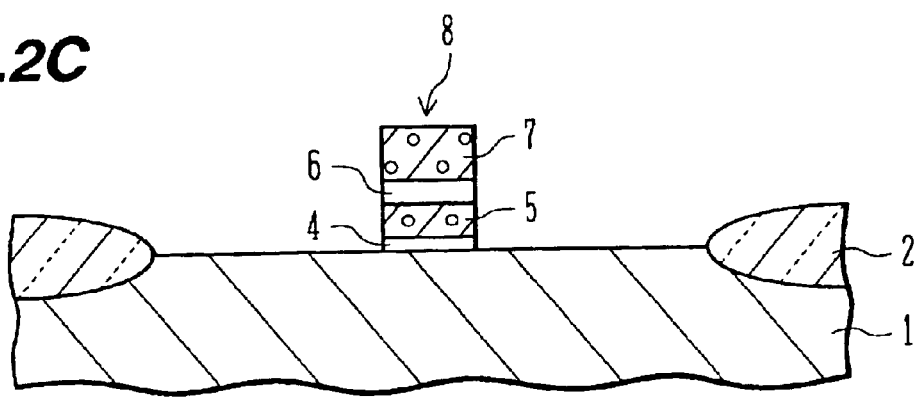

As shown in FIG. 2C, the lamination structure from the polysilicon film 7a to silicon oxide film 4a is patterned to leave a laminated mesa 8 including a tunneling insulating film 4, floating gate electrode 5, dielectric film 6 and upper control gate electrode 7 stacked one upon another. The oxide film 4a may be left on the surface of the active region 3 by etching the lamination structure to the bottom surface of the polysilicon film 5a. The width of the laminated mesa 8 is about 100 nm. The laminated mesa 8 traverses the active region 3 to divide it into two regions, and opposite end portions of the laminated mesa 8 extend to the field oxide film 2, as shown in FIG. 1A. One end portion (upper end portion shown in FIG. 1A) extends on the field oxide film 2 longer than the other.

Figure 2D:
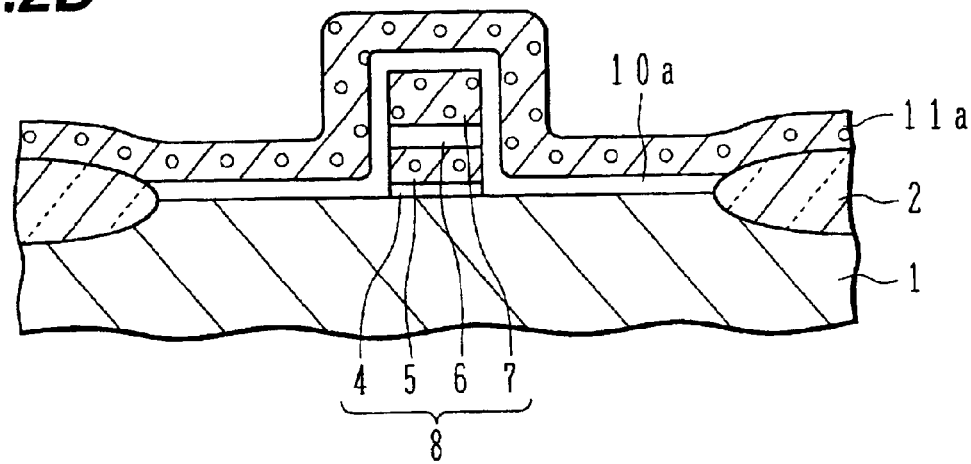

As shown in FIG. 2D, the surfaces of the active region 3 and laminated mesa 8 are thermally oxidized to form a silicon oxide film 10a having a thickness of 5 to 10 nm. A polysilicon film 11a having a thickness of 100 nm is deposited over the whole substrate surface by CVD. During the growth of the polysilicon film 11a, phosphorous is doped therein to an impurity concentration of $1\times10^{20}$ cm$^{-3}$.

Figure 2E:
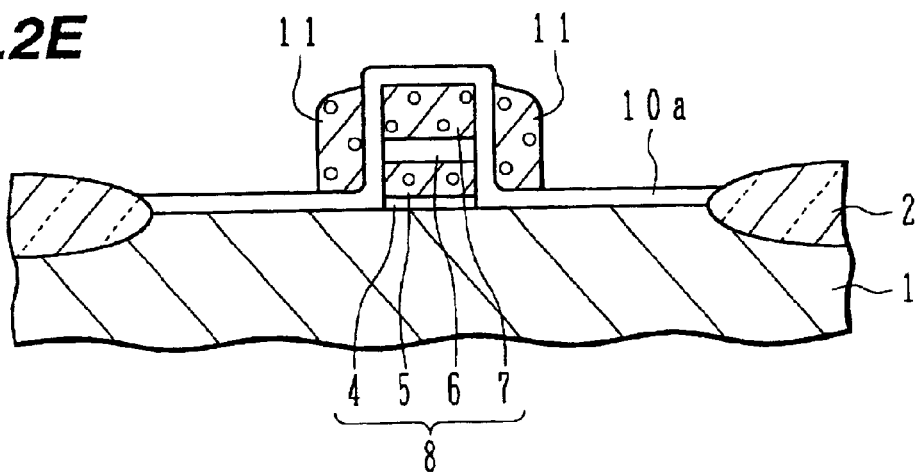

The processes up to the state shown in FIG. 2E will be described. A resist pattern is formed on the surface of the polysilicon film 11a, covering only the area where the pad 11A shown in FIG. 1A is to be formed. The polysilicon film 11a is anisotropically etched to leave the side control gate electrode 11 on the side wall of the laminated mesa 8. The pad 11A shown in FIG. 1A is left on the field oxide film 2.

Figure 2F:
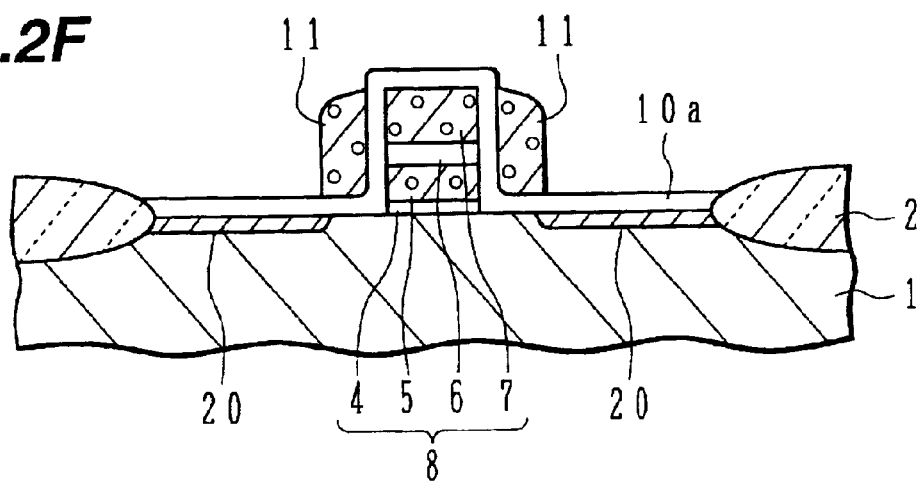

As shown in FIG. 2F, arsenic (As) ions are implanted under the conditions of an acceleration energy of 5 keV and a dose of $4\times10^{13}$ cm$^{-2}$. Arsenic (As) doped extension regions 20 are therefore formed in the surface layer of the active region 3 outside of the side control gate electrode 11. Since ions are implanted into the extension regions 20 after the side control gate electrode 11 are formed, the extension regions 20 will not overlap the floating gate 5 as viewed along the substrate normal direction.

Thereafter, as shown in FIG. 1B, a side wall insulating film 15 is formed on the side wall of the side control gate electrode 11. This side wall insulating film 15 is formed by forming a silicon oxide film over the whole substrate surface and thereafter anisotropically etching the silicon oxide film.

Arsenic (As) ions are implanted into the surface layer of the active region 3 under the conditions of an acceleration energy of 40 keV and a dose of $5\times10^{14}$ cm$^{-2}$. A source region 21 and a drain region 22 are therefore formed in the surface layer of the active region 3 outside of the side wall insulating film 15.

Thereafter, cobalt silicide films 25, 26 and 27 are formed on the exposed surfaces of the source region 21, drain region 22, upper control gate electrode 7 and the side control gate electrode 11. A method of forming a cobalt silicide film will be described briefly.

First, a cobalt film is deposited over the whole substrate surface. Cobalt and silicide are reacted by a heat treatment at a temperature of 550° C. for 30 seconds. An unreacted cobalt film is removed by using a mixture solution of sulfuric acid and hydrogen peroxide. Another heat treatment is performed at a temperature of 840° C. for 30 seconds. The cobalt silicide films 25, 26 and 27 are therefore formed. The cobalt silicide film 27 formed on the upper control gate electrode 7 and the side control gate electrode 11 electrically connects these gate electrodes.

In the first embodiment, the upper control gate 7 and the side control gate electrode 11 of the semiconductor memory provide a function similar to the control gate 108 of the semiconductor memory already proposed and shown in FIG. 10. The side control gate electrode 11 disposed on the side of the floating gate electrode 5 is formed in a self-alignment manner relative to the floating gate electrode 5 without photolithography processes. It is therefore possible to prevent a lowered yield to be caused by position misalignment of the photolithography processes.

In the first embodiment, the gate bus line 120 shown in FIG. 1A is formed in a wiring layer higher than the pad 11A. If the resistance of the pad 11A is sufficiently small, the pad 11A may be extended along an extension line of the gate bus line 120 to be connected to pads 11A of adjacent memory cells. In this manner, the pads 11A may be used as the gate bus line.

The dielectric film 6 and gate insulating film 10 shown in FIG. 1B are made of silicon oxide formed by thermal oxidization. They may be made of silicon nitride (SiN), tantalum oxide (Ta$_2$O$_5$) or the like. Silicon nitride and tantalum oxide have a dielectric constant higher than silicon oxide. Therefore, even if the dielectric film 6 and gate insulating film 10 are made thick, a sufficiently large electrostatic capacitance can be obtained. By thickening these films, leak current between the control gate electrode and floating gate electrode can be reduced.

Next, with reference to FIGS. 3A and 3B, a semiconductor memory according to the second embodiment of the invention will be described.

Figure 3A:
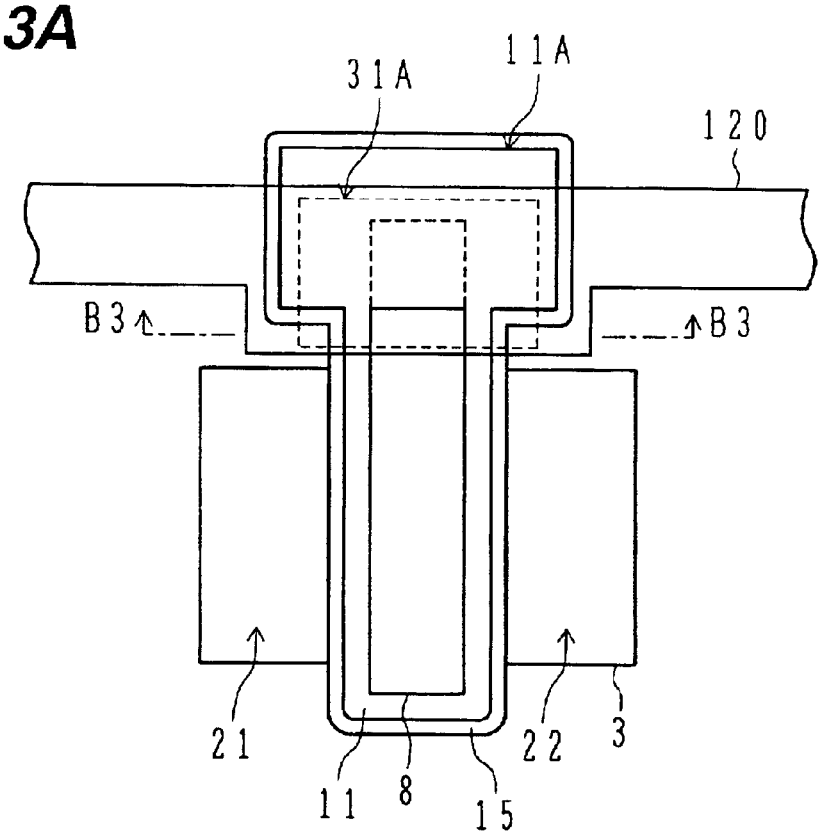
FIGS. 3A and 3B are a plan view and a cross sectional view of a semiconductor memory according to a second embodiment of the invention.

FIG. 3A is a plan view of a semiconductor memory of the second embodiment. The structures of a laminated mesa 8, a gate insulating film 10, the side control gate electrode 11 and side wall insulating film 15 of the semiconductor memory of the second embodiment are similar to the first embodiment shown in FIGS. 1A and 1B. FIG. 3B is a cross sectional view taken along one-dot chain line B3—B3 shown in FIG. 3A. This cross sectional view shows an area where the laminated mesa 8 on the active region is connected to the pad 11A.

Figure 3B:
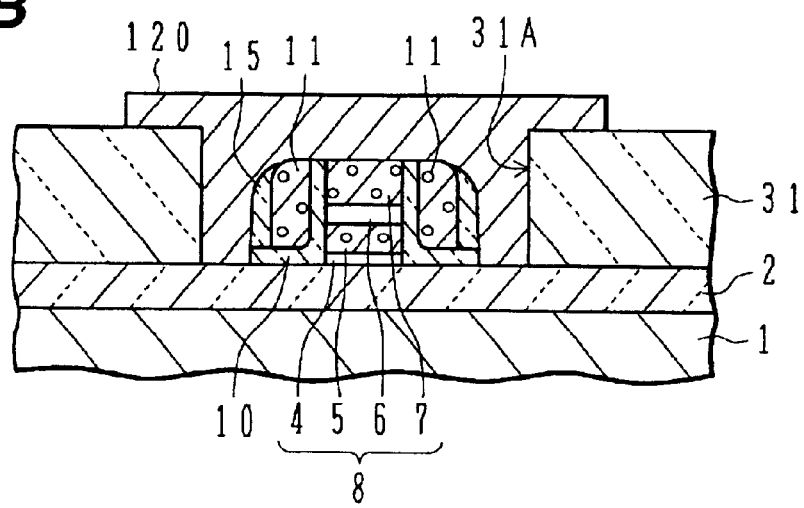

As shown in FIG. 3B, an interlayer insulating film 31 is formed on a substrate with floating gate type TFTs. A contact hole 31A is formed through the interlayer insulating film. As shown in FIG. 3A, the contact hole 31A exposes a partial upper surface of the pad 11A and an upper surface of the laminated mesa 8 between the active region 3 and pad 11A.

A gate bus line 120 of aluminum or the like is formed on the interlayer insulating film 31. The gate bus line 120 is electrically connected to the pad 11A exposed on the bottom of the contact hole 31A. In the area between the pad 11A and active region 3, the gate bus line 120 is in contact with the upper surfaces of the upper control gate electrode 7 and the side control gate electrode 11 to electrically connect these gates.

In the first embodiment, as shown in FIG. 1B, the cobalt silicide film 27 electrically connects the upper control gate electrode 7 and the side control gate electrode 11. In the second embodiment, without forming the cobalt silicide film, the upper control gate electrode 7 and the side control gate electrode 11 can be electrically connected.

Next, with reference to FIGS. 4A to 4C and FIGS. 5A to 5D, a semiconductor memory according to the third embodiment of the invention will be described.

Figure 4A:
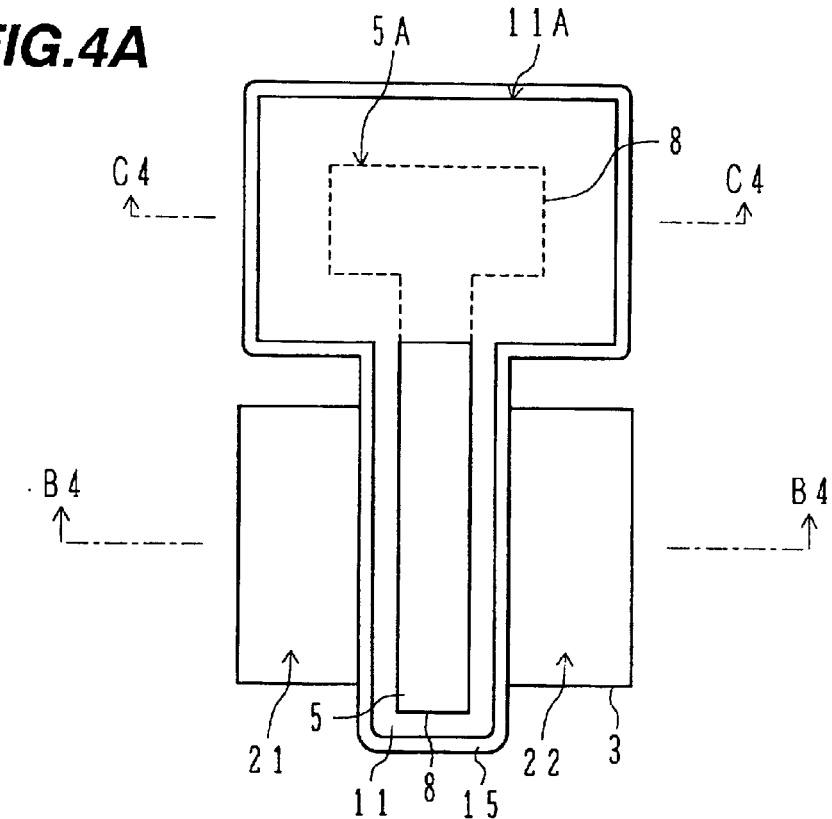
FIG. 4A is a plan view of a semiconductor memory according to a third embodiment of the invention.
Figure 4B:
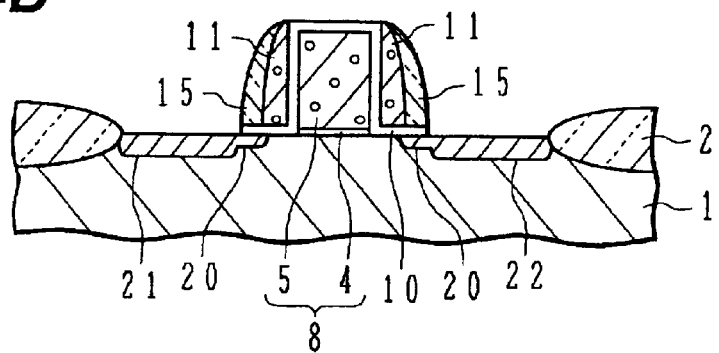
FIGS. 4B and 4C are cross sectional views of the semiconductor memory.
Figure 4C:
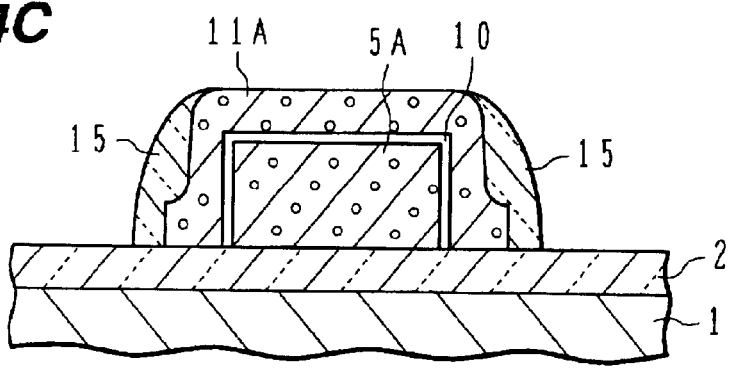

FIG. 4A is a plan view of a semiconductor memory according to the third embodiment. FIGS. 4B and 4C are cross sectional views taken along one-dot chain lines B4—B4 and C4—C4 shown in FIG. 4A. In the first embodiment, as shown in FIG. 1B, the upper control gate electrode 7 is formed over the floating gate electrode 5, with the dielectric film 6 being interposed therebetween. In the third embodiment, the upper control gate electrode is not formed.

As shown in FIG. 4B, in the active region of a silicon substrate 1, a laminated mesa 8 is formed including a tunneling insulating film 4 and floating gate electrode 5. A gate insulating film 10 covers the surface of the laminated mesa 8 and a partial surface area of the active region on both sides of the laminated mesa 8. A control gate electrode 11 is formed on the side wall of the laminated mesa 8, with the gate insulating film 10 being interposed therebetween. The side wall insulating film 15 is disposed on the side wall of the control gate electrode 11.

Arsenic (As) doped extension regions 20 are formed in the surface layer of the active region under the side wall insulating film 15. In the surface layer of the active region 3 outside of the side wall insulating film 15, arsenic doped source and drain regions 21 and 22 are formed.

As shown in FIG. 4A, the floating gate electrode 5 traverses the active region 3 and its one end portion extends to the field oxide film 2. The one end portion of the floating gate electrode 5 is broadened on the field oxide film 2 to form a broadened portion 5A occupying a large area. The control gate electrode 11 also extends to the field oxide film 2 and its one end portion is broadened to form a pad 11A.

As shown in FIG. 4C, the pad 11A covers the upper and side surfaces of the broadened portion 5A of the floating gate electrode 5. The gate insulating film 10 is disposed between the broadened portion 5A and pad 11A.

A method of manufacturing a semiconductor memory of the third embodiment will be described with reference to FIGS. 5A to 5D. In the following embodiments, film forming conditions, film thicknesses, impurity concentrations and the like are assumed to be similar to corresponding ones of the first embodiment, unless otherwise differently stated.

Figure 5A:
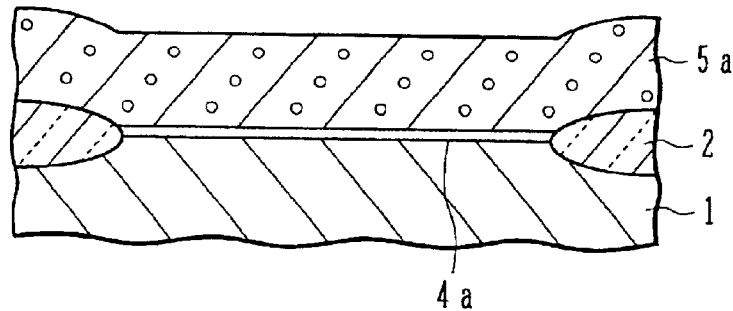
FIGS. 5A to 5D are cross sectional views of a substrate illustrating a method of manufacturing a semiconductor memory according to the third embodiment of the invention.

As shown in FIG. 5A, on the surface of a silicon substrate 1, a field oxide film 2 is formed to define an active region 3. On the surface of the active region 3, a silicon oxide film 4a is formed. An n-type polysilicon film 5a having a thickness of 180 nm is formed over the whole substrate surface.

Figure 5B:
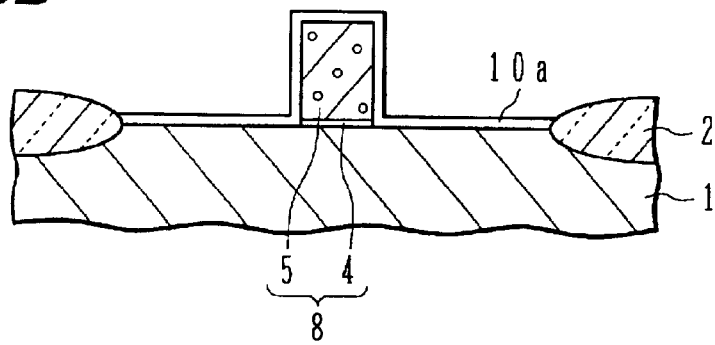

As shown in FIG. 5B, the polysilicon film 5a and silicon oxide film 4a are patterned to leave a laminated mesa 8 including a tunneling insulating film 4 and a floating gate electrode 5 stacked one upon the other. The surfaces of the active region 3 and floating gate electrode 5 are thermally oxidized to form a silicon oxide film 10a.

Figure 5C:
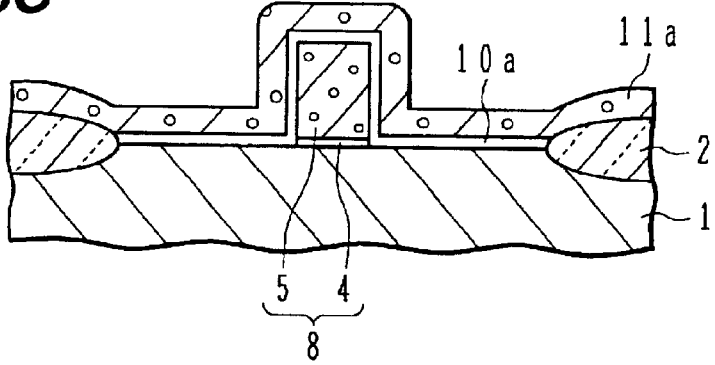

As shown in FIG. 5C, an n-type polysilicon film 11a having a thickness of 100 nm is formed over the whole substrate surface. A resist pattern is formed covering a surface of the polysilicon film 11a where the pad 11A shown in FIG. 4A is to be formed.

Figure 5D:
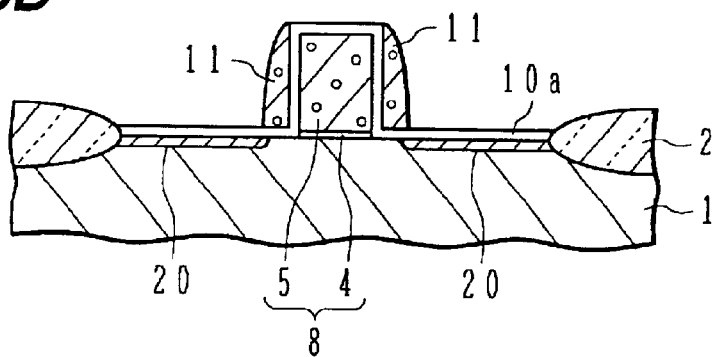

As shown in FIG. 5D, the polysilicon film 11a is anisotropically etched to leave control gate electrodes 11 on the side wall of the laminated mesa 8. Since the resist pattern covers the area where the pad 11A shown in FIG. 4A is to be formed, the pad 11A of the polysilicon film 11a is left also on the broadened portion 5A of the floating gate electrode.

Extension regions 20 are formed by implanting arsenic (As) ions into the surface layer of the active region. Thereafter, as shown in FIG. 4B, side wall insulating film 15 is formed and source and drain regions 21 and 22 are formed through ion implantation.

In the third embodiment, the control gate is not formed on the floating gate electrode 5, although it is formed in the case of FIG. 4A. By increasing the height of the floating gate electrode 5, an electrostatic capacitance between the floating gate electrode 5 and control gate electrode 11 can be increased. Since the floating gate electrode 5 is broadened on the field oxide film 2, an electrostatic capacitance between the floating gate electrode 5 and control gate electrode 11 can be increased further.

With a large electrostatic capacitance between the floating gate electrode 5 and control gate electrode 11, the effect of a voltage applied to the control gate electrode 11 propagates to the channel region via the floating gate electrode 5. An operating voltage can therefore be lowered.

Next, with reference to FIGS. 6A to 7F, a semiconductor memory according to the fourth embodiment will be described.

Figure 6A:
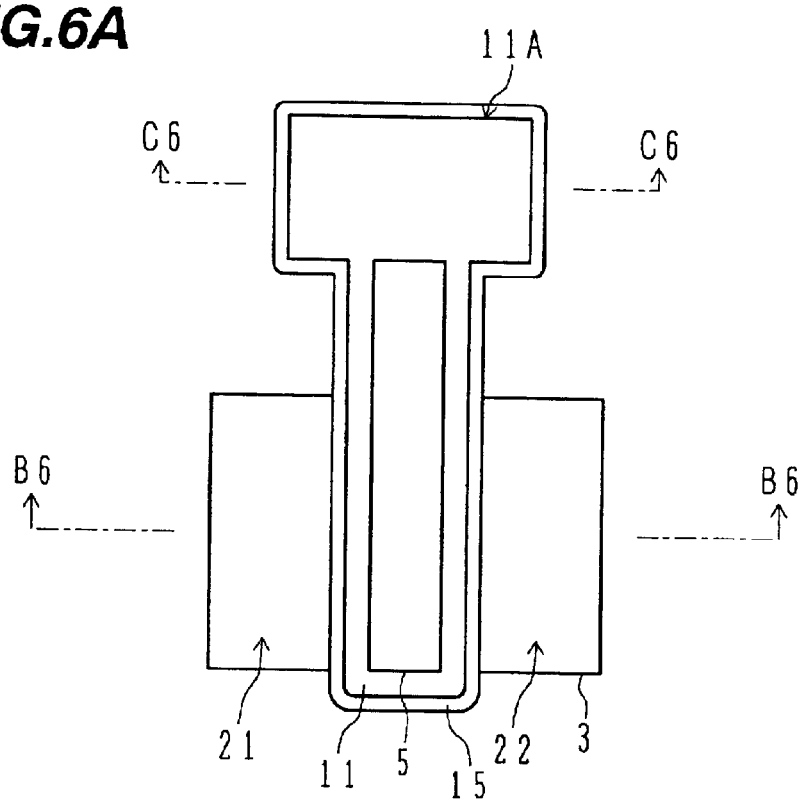
FIG. 6A is a plan view of a semiconductor memory according to a fourth embodiment of the invention.
Figure 6B:
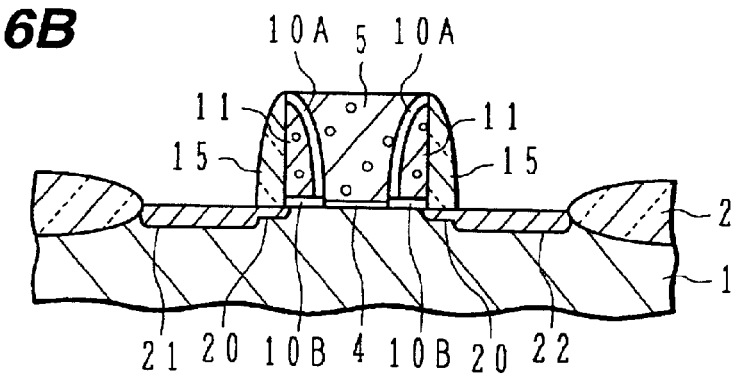
FIGS. 6B and 6C are cross sectional views of the semiconductor memory.
Figure 6C:
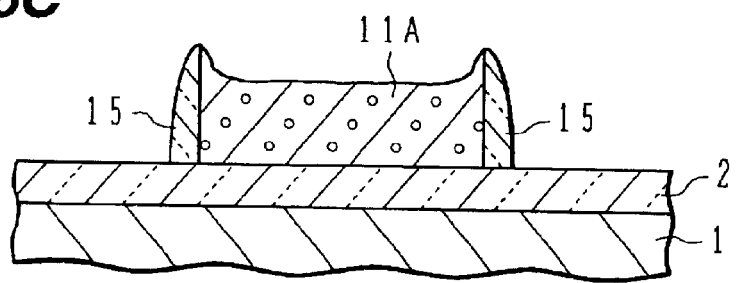

FIG. 6A is a plan view of a semiconductor memory of the fourth embodiment. FIGS. 6B and 6C are cross sectional views taken along one-dot chain lines B6—B6 and C6—C6 shown in FIG. 6A. The description is given concerning about different points from the structure of the semiconductor memory of the third embodiment shown in FIGS. 4A to 4C.

In the third embodiment, as shown in FIG. 4B, the side wall of the floating gate electrode 5 has a shape conformal to the plane generally vertical to the substrate plane. In contrast, in the fourth embodiment, as shown in FIG. 6B, the side wall of the floating gate electrode 5 curves broadening its width as the height from the surface of a silicon substrate 1 becomes large. The interface between the control gate electrode 11 and side wall insulating film 15 has a shape conformal to the plane generally vertical to the substrate plane.

In the third embodiment, as shown in FIG. 4C, the pad 11A covers the broadened portion 5A of the floating gate electrode. In contrast, in the fourth embodiment, a pad 11A is formed directly on a field oxide film 2 as shown in FIG. 6C.

In the third embodiment, the broadened portion 5A of the floating gate electrode 5 is disposed on the field oxide film 2, and the pad 11A is superposed upon the broadened portion 5A. In contrast, in the fourth embodiment, the floating gate electrode 5 overlaps the pad 11A almost not at all.

Next, with reference to FIGS. 7A to 7F, a method of manufacturing a semiconductor memory of the fourth embodiment will be described.

Figure 7A:
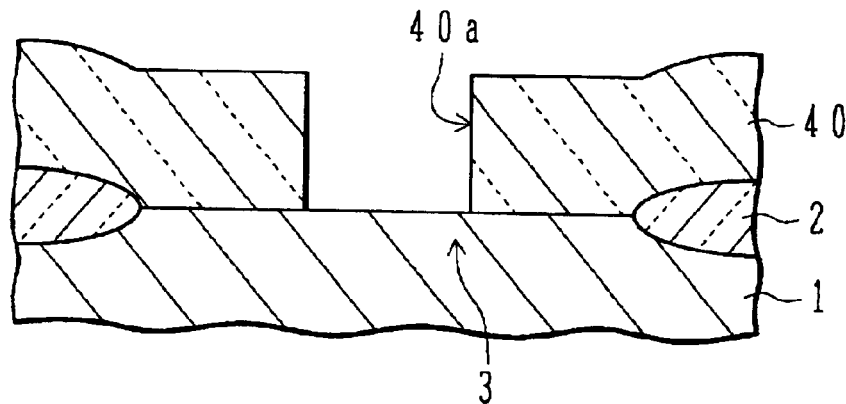
FIGS. 7A to 7F are cross sectional views of a substrate illustrating a method of manufacturing a semiconductor memory according to the fourth embodiment of the invention.

As shown in FIG. 7A, a field oxide film 2 is formed on the surface of a silicon substrate 1 to define an active region 3. Boron ions are implanted into the surface layer of the active region 3. The processes up to this are similar to the first embodiment described with FIG. 2A. A silicon oxide film 40 having a thickness of 180 nm is deposited by CVD, covering the whole substrate surface. An opening 40a is formed through the silicon oxide film 40, having a pattern corresponding to the control gate 11 and pad 11A shown in FIG. 6A. The width of the opening 40a is about 300 nm in the area inside of the active region 3. The surface of the active region 3 is exposed on the bottom of the opening 40a.

Figure 7B:
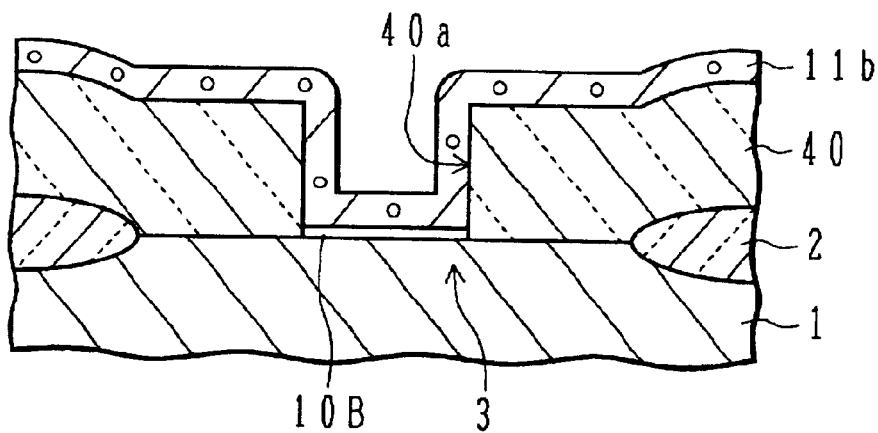

As shown in FIG. 7B, the surface of the active region 3 exposed on the bottom of the opening 40a is thermally oxidized to form a gate insulating film 10B having a thickness of about 5 nm. An n-type polysilicon film 11b having a thickness of 100 nm is deposited covering the upper surface of the silicon oxide film 40 and the side and bottom surfaces of the opening 40a. A resist pattern is formed covering the upper surface of the polysilicon film 11b where the pad 11A shown in FIG. 6A is to be formed.

Figure 7C:
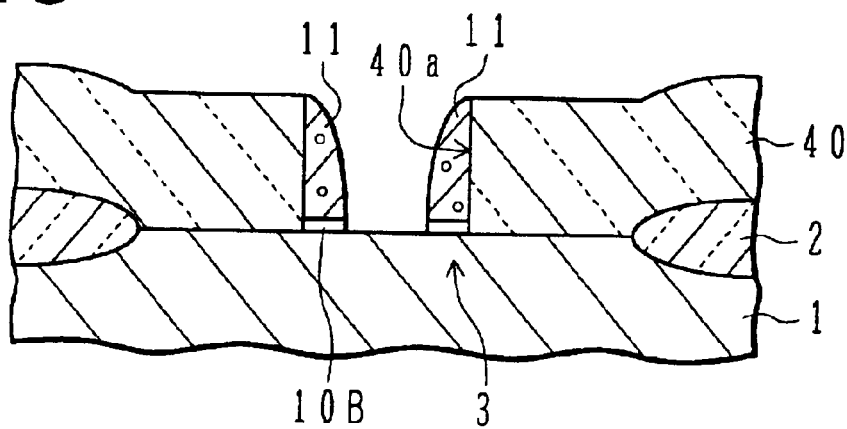

As shown in FIG. 7C, the polysilicon film 11b is anisotropically etched to leave control gate electrodes 11 of polysilicon on the side wall of the opening 40a. The gate insulating film 10B exposed between the control gate electrodes 11 is removed to expose the surface of the active region 3. The pad 11A shown in FIG. 6C is left in an area covered with the resist pattern. After the resist pattern is removed, the exposed silicon surface is thermally oxidized.

Figure 7D:
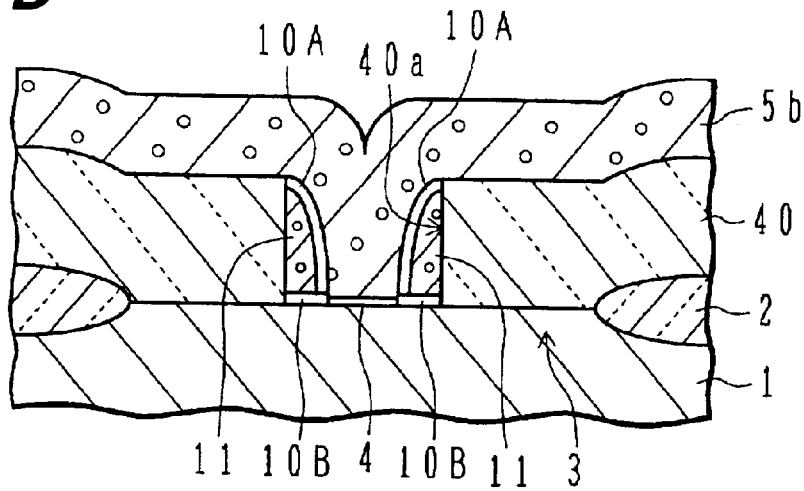

As a result, as shown in FIG. 7D, a tunneling insulating film 4 is formed on the surface of the active region 3 and a gate insulating film 10A is formed on the side wall of the control gate electrode 11. An oxidation speed of polysilicon is faster than that of single crystal silicon. If thermal oxidation is performed under the condition that the thickness of the tunneling insulating film 4 becomes 3 nm, the thickness of the gate insulating film 10A becomes thicker than 3 nm, which is sufficient not to transmit carriers therethrough by the tunneling phenomenon.

An n-type polysilicon film 5b having a thickness of 100 nm is deposited over the whole substrate surface. The opening 40a is therefore buried with the polysilicon film 5b.

Figure 7E:
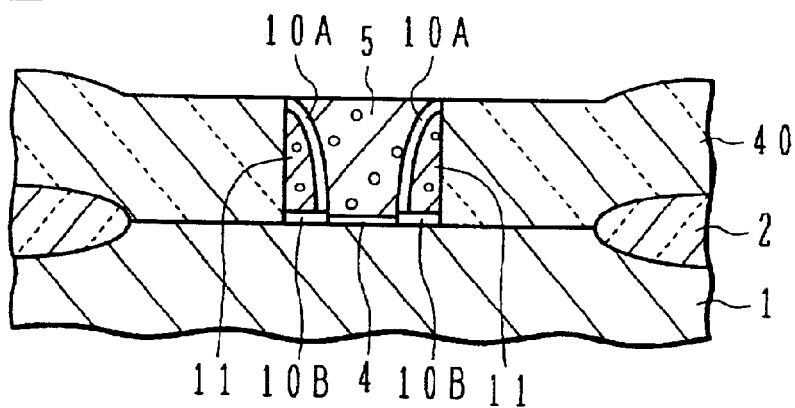

As shown in FIG. 7E, the polysilicon film 5b is etched back until the upper surface of the silicon oxide film 40 is exposed. A floating gate electrode 5 of polysilicon is therefore left in the opening 40a. The polysilicon film 5b deposited on the pad 11A is removed as shown in FIG. 6C. At this stage, the upper surface of the pad 11A is covered with the gate insulating film 10A shown in FIG. 7D. This gate insulating film 10A functions as an etch stopper film during the etch-back process.

Figure 7F:
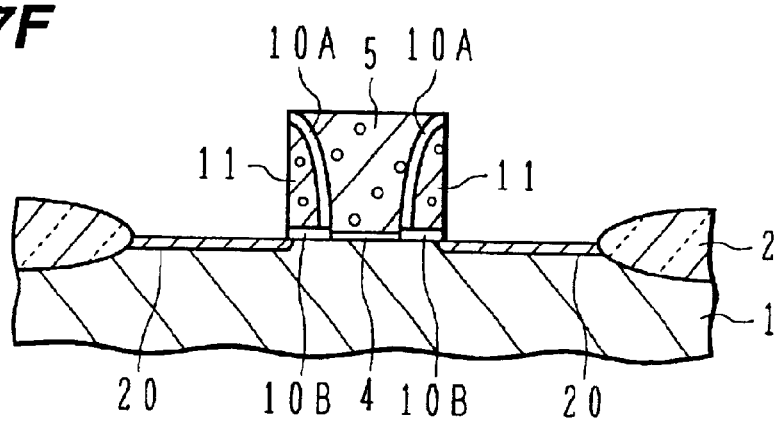

As shown in FIG. 7F, the silicon oxide film 40 is removed. The silicon oxide film 40 may be removed by wet etching using hydrofluoric acid. At this time the gate insulating film covering the upper surface of the pad 11A shown in FIG. 6C is removed. Arsenic (As) ions are implanted into the surface layer of the active region 3 to form extension regions 20.

As shown in FIG. 6B, the side wall insulating film 15 of silicon oxide is formed on the side wall of the control gate electrode 11. Thereafter, ions are implanted to form a source region 21 and a drain region 22.

In the semiconductor memory of the fourth embodiment, as shown in FIG. 6B, the width of the floating gate 5 curves broadening its width as the height from the surface of the silicon substrate 1 becomes large. The area via which the floating gate electrode 5 and control gate electrode 11 face each other is broadened and the electrostatic capacitance therebetween can be increased.

The gate length of the floating gate electrode 5 is shorter than the width of the opening 40a shown in FIG. 7A. By setting the width of the opening 40a to the minimum process size of photolithography, the gate length can be made shorter than the minimum process size.

Figure 8A:
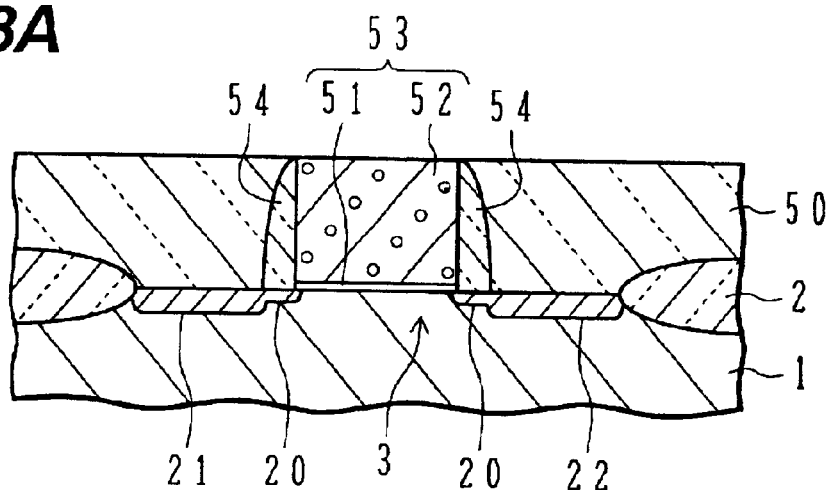
FIGS. 8A and 8B are cross sectional views of a substrate illustrating a method of manufacturing a semiconductor memory according to a fifth embodiment of the invention.

Next, with reference to FIGS. 8A and 8B, a semiconductor memory according to the fifth embodiment will be described. In the fourth embodiment, after the floating gate electrode 5 and control gate electrodes 11 are formed, the extension regions 20, source region 21 and drain region 22 are formed. The floating gate electrode 5 and control gate electrodes 11 and the like are exposed to the heat treatment for activating impurities. In the fifth embodiment, impurity implantation and activation heat treatment are performed beforehand.

The processes up to the state shown in FIG. 8A will be described. A field oxide film 2 is formed on the surface of a silicon substrate 1 to define an active region 3. A laminated mesa 53 is formed on the active region 3, traversing the active region 3. The laminated mesa 53 is constituted of two layers, a silicon oxide film 51 and a polysilicon film 52. The thickness of the silicon oxide film 51 is about 10 nm, whereas that of the polysilicon film 52 is about 180 nm. By using the laminated mesa 53 as a mask, arsenic (As) ions are implanted into the surface layer of the active region 3 to form extension regions 20.

Side wall insulating films 54 of silicon oxide are formed on the side wall of the laminated mesa 53. By using the laminated mesa 53 and side wall insulating films 54 as a mask, arsenic (As) ions are implanted into the surface layer of the active region 3 to form a source region 21 and a drain region 22.

A silicon oxide film 50 having a thickness of 200 nm is deposited over the whole substrate surface. The silicon oxide film 50 is polished through chemical mechanical polishing (CMP) until the upper surface of the polysilicon film 52 is exposed, to thereby planarize the surface of the silicon oxide film 50.

Figure 8B:
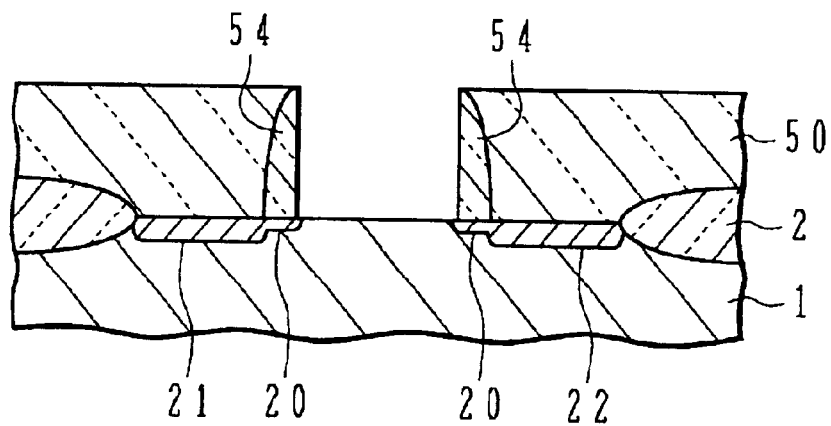

As shown in FIG. 8B, the polysilicon film 52 and silicon oxide film 51 are removed. This state is equivalent to the state shown in FIG. 7A of the fourth embodiment additionally formed with the extension regions 20, source region 21 and drain region 22. Thereafter, similar to the fourth embodiment, the control gate electrode, floating gate electrodes and the like are formed. The processes up to this form a semiconductor memory having the structure similar to that shown in FIG. 6B of the fourth embodiment.

In the fifth embodiment, ion implantation and a high temperature process for ion activation are not necessary after the control gate electrode 5, floating gate electrodes 11, and gate electrodes 10A and 10B are formed. Therefore, as the materials of these electrodes, metal materials or high dielectric materials even with low heat resistance can be used.

Next, with reference to FIGS. 9A to 9D, a method of manufacturing a semiconductor memory according to the sixth embodiment will be described.

Figure 9A:
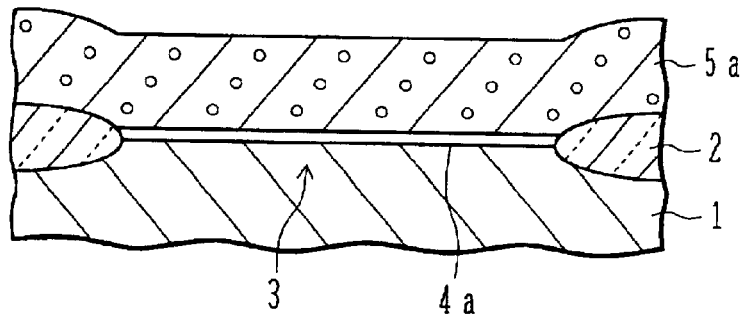
FIGS. 9A to 9D are cross sectional views of a substrate illustrating a method of manufacturing a semiconductor memory according to a sixth embodiment of the invention.

As shown in FIG. 9A, a field oxide film 2 is formed on the surface of a silicon substrate 1 to define an active region 3. A silicon oxide film 4a is formed on the surface of the active region 3. A polysilicon film 5a having a thickness of 180 nm is formed covering the whole substrate surface. The processes up to this are similar to the third embodiment described with FIG. 5A.

Figure 9B:
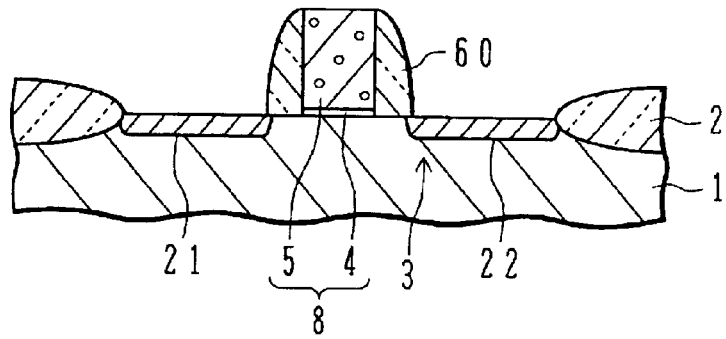

As shown in FIG. 9B, the polysilicon film 5a and silicon oxide film 4 are patterned to leave a laminated mesa 8 including a tunneling insulating film 4 and floating gate electrode 5 stacked one upon the other. The laminated mesa 8 has a similar pattern to that of the laminated mesa 8 shown in FIG. 4A of the third embodiment.

Side wall insulating films 60 of silicon oxide are formed on the side wall of the laminated mesa 8. By using the laminated mesa 8 and side wall insulating films 60 as a mask, arsenic (As) ions are implanted into the surface layer of the active region 3 to form a source region 21 and a drain region 22. After this ion implantation, the side wall insulating films 60 are removed.

Figure 9C:
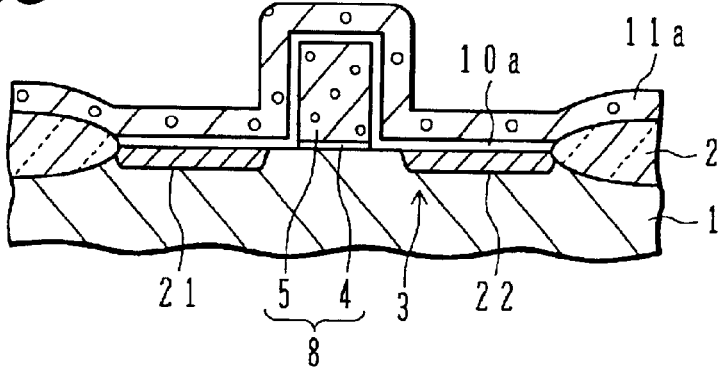

As shown in FIG. 9C, the surfaces of the active region 3 and floating gate electrode 5 are thermally oxidized to form a gate insulating film 10a of silicon oxide. An n-type polysilicon film 11a is deposited covering the whole substrate surface. A resist pattern is formed covering the surface of the polysilicon film 11a where the pad 11A shown in FIG. 4A is to be formed.

Figure 9D:
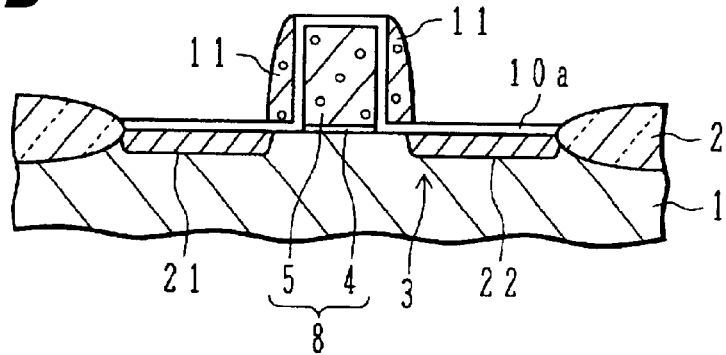

As shown in FIG. 9D, the polysilicon film 11a is anisotropically etched to leave control gate electrodes 11 on the side wall of the laminated mesa 8. A pad similar to the pad 11A shown in FIG. 4A is therefore left on the field oxide film 2. The resist pattern used is thereafter removed.

In the sixth embodiment, ion implantation and activation heat treatment are not used after the gate insulating film 10a is formed. It is therefore possible to use high dielectric material even with low heat resistance as the material of the gate insulating film 10a. The gate insulating film of high dielectric material is formed, for example, by CVD.

In the sixth embodiment, as different from the third embodiment shown in FIG. 4B, the extension regions are not formed under the control gate electrodes 11. However, since the inversion layer is formed earlier under the control gate electrodes 11 than under the floating gate electrode 5, the transistor operation is not hindered.

In the semiconductor memories of the first to sixth embodiments, one memory cell is constituted of only one floating gate type FET. High integration is therefore possible.

In the above embodiments, an n-channel floating gate type FET is formed by using a $p^-$-type silicon substrate. Instead, a p-channel floating gate type FET may be formed by using an n-type silicon substrate. In this case, the polarity of a voltage applied between the source/drain regions 2 and 3 and the control gate electrode 8 is inverted.

The present invention has been described in connection with the preferred embodiments. The invention is not limited only to the above embodiments. It is apparent that various modifications, improvements, combinations, and the like can be made by those skilled in the art.

What is claimed is:

1. A semiconductor memory comprising:

a semiconductor substrate;

a tunneling insulating film formed on a partial surface area of said semiconductor substrate, said tunneling insulating film having a thinness enough to transmit carriers therethrough by a direct tunneling phenomenon;

a floating gate electrode formed on said tunneling insulating film;

a gate insulating film covering a side wall of said floating gate electrode and a partial surface area of said semiconductor substrate on both sides of said floating gate electrode, said gate insulating film having a thickness not allowing carriers to transmit therethrough by the direct tunneling phenomenon;

a first control gate electrode disposed on said gate insulating film over the side wall of said floating gate electrode and over a partial surface area of said semiconductor substrate on both sides of said floating gate electrode;

a pair of impurity doped regions formed in a surface layer of said semiconductor substrate on both sides of a gate structure including said floating gate electrode and said first control gate electrode;

a dielectric film formed on an upper surface of said floating gate electrode, said dielectric film having a thickness not allowing carriers to transmit therethrough by the direct tunneling phenomenon; and a second control gate electrode formed on said dielectric film and electrically connected to said first control gate electrode by a film located above said first and second control gate electrodes, said second control gate electrode and said floating gate electrode constituting a capacitor, wherein said first control gate electrode is formed on said gate insulating film also over a side wall of said second control gate electrode.

2. A semiconductor memory according to claim 1, wherein materials of said floating gate electrode and a channel region between said pair of impurity doped regions are selected so that a Fermi level of said floating gate electrode is in a forbidden band of the channel region when an external voltage is not applied between the channel region and said first control gate electrode.

3. A semiconductor memory according to claim 1, wherein the top surfaces of the impurity doped regions are covered with a metal silicide film, and the film located above the first and second control gate electrodes is made of the same material as the metal silicide film.

4. A semiconductor memory comprising:

a semiconductor substrate;

a tunneling insulating film formed on a partial surface area of said semiconductor substrate, said tunneling insulating film having a thinness of at most 3 nm;

a floating gate electrode formed on said tunneling insulating film;

a gate insulating film covering a side wall of said floating gate electrode and a partial surface area of said semiconductor substrate on both sides of said floating gate electrode, said gate insulating film having a thickness not allowing carriers to transmit therethrough by a direct tunneling phenomenon;

a first control gate electrode disposed on said gate insulating film over the side wall of said floating gate electrode and over a partial surface area of said semiconductor substrate on both sides of said floating gate electrode;

a pair of impurity doped regions formed in a surface layer of said semiconductor substrate on both sides of a gate structure including said floating gate electrode and said first control gate electrode;

a dielectric film formed on an upper surface of said floating gate electrode, said dielectric film having a thickness not allowing carriers to transmit therethrough by the direct tunneling phenomenon; and a second control gate electrode formed on said dielectric film and electrically connected to said first control gate electrode by a film located above said first and second control gate electrodes, said second control gate electrode and said floating gate electrode constituting a capacitor, wherein said first control gate electrode is formed on said gate insulating film also over a side wall of said second control gate electrode.

5. A semiconductor memory according to claim 4, wherein said tunneling insulating film has a thickness of at least 2 nm.

6. A semiconductor memory comprising:

a semiconductor substrate;

a tunneling insulating film formed on a partial surface area of said semiconductor substrate, said tunneling insulating film having a thinness enough to transmit carriers therethrough by a direct tunneling phenomenon;

a floating gate electrode formed on said tunneling insulating film;

a gate insulating film covering a side wall of said floating gate electrode and a partial surface area of said semiconductor substrate on both sides of said floating gate electrode, said gate insulating film having a thickness not allowing carriers to transmit therethrough by the direct tunneling phenomenon;

a first control gate electrode disposed on said gate insulating film over the side wall of said floating gate electrode and over a partial surface area of said semiconductor substrate on both sides of said floating gate electrode;

a pair of impurity doped regions formed in a surface layer of said semiconductor substrate on both sides of a gate structure including said floating gate electrode and said first control gate electrode;

a dielectric film formed on an upper surface of said floating gate electrode, said dielectric film having a thickness not allowing carriers to transmit therethrough by the direct tunneling phenomenon; and a second control gate electrode formed on said dielectric film and electrically connected to said first control gate electrode by a film located above said first and second control gate electrodes, said second control gate electrode and said floating gate electrode constituting a capacitor, wherein a surface layer of said semiconductor substrate under said first control gate electrode has a conductivity opposite to that of said impurity doped regions, and wherein said first control gate electrode is formed on said gate insulating film also over a side wall of said second control gate electrode.

* * * * *